United States Patent
Mohapatra et al.

(10) Patent No.: US 10,886,408 B2
(45) Date of Patent: Jan. 5, 2021

(54) GROUP III-V MATERIAL TRANSISTORS EMPLOYING NITRIDE-BASED DOPANT DIFFUSION BARRIER LAYER

(71) Applicant: INTEL CORPORATION, Santa Clara, CA (US)

(72) Inventors: Chandra S. Mohapatra, Hillsboro, OR (US); Harold W. Kennel, Portland, OR (US); Glenn A. Glass, Portland, OR (US); Willy Rachmady, Beaverton, OR (US); Anand S. Murthy, Portland, OR (US); Gilbert Dewey, Beaverton, OR (US); Jack T. Kavalieros, Portland, OR (US); Tahir Ghani, Portland, OR (US); Matthew V. Metz, Portland, OR (US); Sean T. Ma, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/327,206

(22) PCT Filed: Sep. 29, 2016

(86) PCT No.: PCT/US2016/054461
§ 371 (c)(1),
(2) Date: Feb. 21, 2019

(87) PCT Pub. No.: WO2018/063248
PCT Pub. Date: Apr. 5, 2018

(65) Prior Publication Data
US 2019/0198658 A1    Jun. 27, 2019

(51) Int. Cl.
*H01L 29/78* (2006.01)
*H01L 21/8234* (2006.01)
(Continued)

(52) U.S. Cl.
CPC .... *H01L 29/785* (2013.01); *H01L 21/823412* (2013.01); *H01L 21/823431* (2013.01);
(Continued)

(58) Field of Classification Search
CPC ............. H01L 29/785; H01L 29/42376; H01L 29/775; H01L 29/66469; H01L 29/66;
(Continued)

(56) References Cited

U.S. PATENT DOCUMENTS 10,446,685 B2    10/2019 Mohapatra et al.
2008/0067495 A1    3/2008 Verhulst
(Continued)

FOREIGN PATENT DOCUMENTS

WO    WO2017052699 A1    3/2017
WO    2018063248 A1    4/2018

OTHER PUBLICATIONS

International Search Report and Written Opinion for PCT Application No. PCT/US2016/054461, dated Jun. 27, 2017. 15 pages.
(Continued)

*Primary Examiner* — Mohammad M Hoque
(74) *Attorney, Agent, or Firm* — Finch & Maloney PLLC

(57) ABSTRACT

Techniques are disclosed for forming group III-V material transistors employing nitride-based dopant diffusion barrier layers. The techniques can include growing the dilute nitride-based barrier layer as a relatively thin layer of III-V material in the sub-channel (or sub-fin) region of a transistor, near the substrate/III-V material interface, for example. Such a nitride-based barrier layer can be used to trap atoms from the substrate at vacancy sites within the III-V material. Therefore, the barrier layer can arrest substrate atoms from diffusing in an undesired manner by protecting the sub-channel layer from being unintentionally doped due to subsequent processing in the transistor fabrication. In addi-
(Continued)

tion, by forming the barrier layer pseudomorphically, the lattice mismatch of the barrier layer with the sub-channel layer in the heterojunction stack becomes insignificant. In some embodiments, the group III-V alloyed with nitrogen (N) material may include an N concentration of less than 5, 2, or 1.5 percent.

20 Claims, 8 Drawing Sheets

(51) Int. Cl.

| | | |
|---|---|---|
| *H01L 27/088* | (2006.01) | |
| *H01L 29/06* | (2006.01) | |
| *H01L 29/423* | (2006.01) | |
| *H01L 29/775* | (2006.01) | |
| *H01L 29/66* | (2006.01) | |
| *H01L 29/20* | (2006.01) | |
| *H01L 27/092* | (2006.01) | |
| *H01L 29/786* | (2006.01) | |
| *H01L 29/10* | (2006.01) | |
| *H01L 29/26* | (2006.01) | |
| *H01L 21/8252* | (2006.01) | |
| *H01L 29/16* | (2006.01) | |

(52) U.S. Cl.
CPC ...... *H01L 27/0886* (2013.01); *H01L 27/0924* (2013.01); *H01L 29/0673* (2013.01); *H01L 29/1033* (2013.01); *H01L 29/20* (2013.01); *H01L 29/26* (2013.01); *H01L 29/42376* (2013.01); *H01L 29/42392* (2013.01); *H01L 29/66* (2013.01); *H01L 29/66469* (2013.01); *H01L 29/66545* (2013.01); *H01L 29/66795* (2013.01); *H01L 29/775* (2013.01); *H01L 29/78696* (2013.01); *H01L 21/8252* (2013.01); *H01L 29/16* (2013.01); *H01L 29/2003* (2013.01)

(58) Field of Classification Search
CPC ............. H01L 29/42392; H01L 29/20; H01L 27/0924; H01L 29/78696; H01L 21/823431; H01L 29/1033; H01L 29/26; H01L 29/66545; H01L 29/66795; H01L 21/823412; H01L 27/0886; H01L 29/0673; H01L 21/8252; H01L 29/16; H01L 29/2003
USPC ....................................................... 257/368
See application file for complete search history.

(56) References Cited

U.S. PATENT DOCUMENTS

| | | | |
|---|---|---|---|
| 2013/0270513 A1 | 10/2013 | Romero et al. | |
| 2014/0084343 A1* | 3/2014 | Dewey | H01L 29/0673 257/192 |
| 2014/0264446 A1 | 9/2014 | Basu et al. | |
| 2015/0162404 A1* | 6/2015 | Yang | H01L 27/0886 257/401 |
| 2015/0187924 A1* | 7/2015 | Dasgupta | H01L 29/7786 257/76 |
| 2015/0332964 A1* | 11/2015 | Cheng | H01L 29/785 257/288 |
| 2016/0064488 A1* | 3/2016 | Takado | H01L 29/157 257/20 |
| 2016/0064544 A1* | 3/2016 | Jacob | H01L 27/0886 257/192 |
| 2016/0103278 A1 | 4/2016 | Cheng et al. | |
| 2016/0204207 A1* | 7/2016 | Then | H01L 21/28264 257/76 |
| 2017/0033221 A1* | 2/2017 | Cai | H01L 29/7851 |
| 2018/0248028 A1 | 8/2018 | Mohapatra et al. | |
| 2019/0237570 A1* | 8/2019 | Beam, III | H01L 29/7783 |
| 2019/0348411 A1* | 11/2019 | Chen | H01L 29/205 |

OTHER PUBLICATIONS

International Preliminary Report on Patentability for PCT Application No. PCT/US2016/054461, dated Apr. 2, 2019. 10 pages.

* cited by examiner ial fin stack formed on a substrate described herein, in accordance with an embodiment of the present disclosure.

GROUP III-V MATERIAL TRANSISTORS EMPLOYING NITRIDE-BASED DOPANT DIFFUSION BARRIER LAYER

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall or so-called gate spacers on either side of the gate that can help determine the channel length and can help with replacement gate processes, for example. Complementary MOS (CMOS) structures typically use a combination of p-channel MOSFETs (p-MOS) and n-channel MOSFETs (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 1C' and 1C" illustrate example alternative trench bottom shapes that may be formed, in accordance with some embodiments.

FIGS. 1D', 1J', 1K', and 1L' are provided to illustrate alternative multilayer fin structures that may be used to form a gate-all-around (GAA) transistor including two nanowires, in accordance with some embodiments.

Figure 1A:
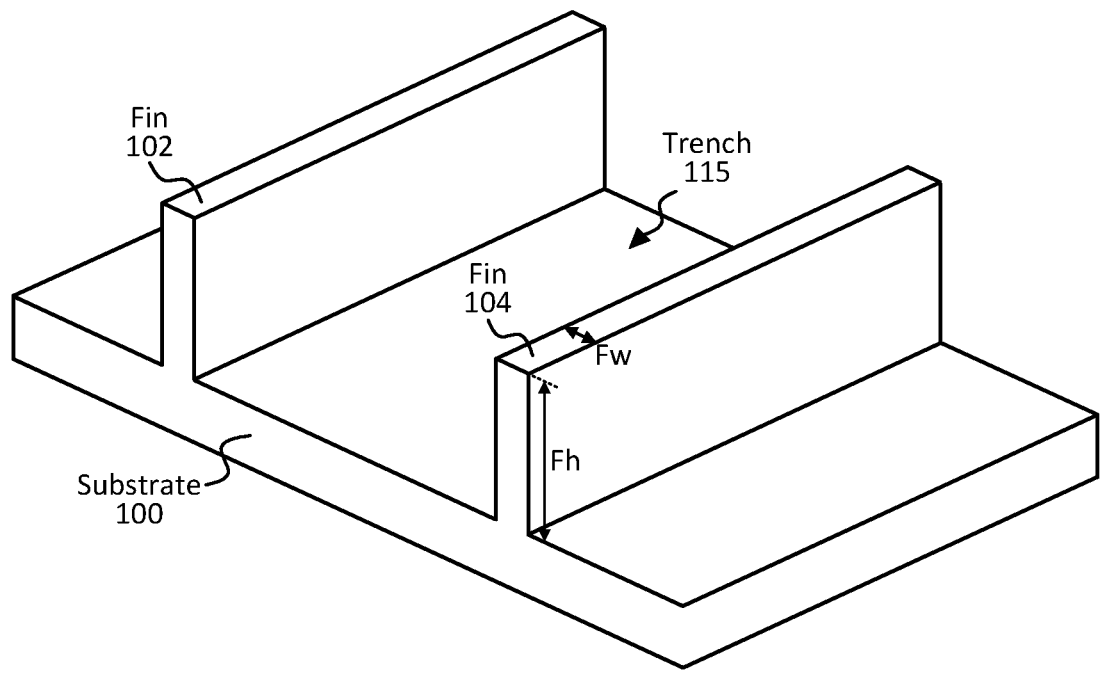
FIGS. 1A-M illustrate example integrated circuit (IC) structures resulting from a method configured to form transistors employing nitride-based dopant diffusion barrier layers, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming group III-V material transistors employing nitride-based dopant diffusion barrier layers. In some embodiments, the techniques include forming a multilayer fin stack having multiple layers including group III-V semiconductor material on a group IV semiconductor material substrate. The multilayer fin stack can be provided by, for example, using blanket deposition of the various desired material layers and then etching those layers into multilayer fins, or using aspect ratio trapping (or so-called ART) process where sacrificial fins are removed and replaced with the desired material layers. ART processes may be beneficial, as they allow for selective deposition where needed and the benefits of trapping (containment of lattice-diverse materials). In some such ART-based embodiments, the layers of the replacement fin stack may include: a channel layer (e.g., to be used in the channel region of the transistor device, and thus, the channel when the device is in an on-state); a sub-channel layer (e.g., upon which the channel layer will be formed); a barrier layer (e.g., to reduce or prevent undesired diffusion of substrate atoms into the sub-channel layer); and an optional nucleation layer (e.g., to 'wet' or otherwise prepare the trench bottom for the growth of other III-V material layers). Thus, the techniques can include forming/growing or otherwise providing the dilute nitride-based barrier layer as a relatively thin layer of III-V material in the sub-fin region of a transistor, near the substrate/III-V material interface, for example. Such a nitride-based barrier layer can be used to trap atoms, which may diffuse from the substrate (e.g., Si and/or Ge atoms), at vacancy sites within the III-V material. Therefore, the barrier layer can arrest atoms from the substrate from diffusing in an undesired manner by protecting the sub-channel layer from being unintentionally doped (e.g., n-type doped) due to subsequent processing in the transistor fabrication. In addition, by forming the barrier layer pseudomorphically (e.g., less than the critical thickness of the material above which dislocations are introduced), the lattice mismatch of the barrier layer with the sub-channel layer becomes insignificant, because such pseudomorphic growth can deter or prevent undesired dislocations from forming. In some embodiments, dilute nitride alloying may include alloying a III-V material (where the group V component of that III-V material does not include nitrogen) with nitrogen (N), such that the final group III-V plus alloy of N ("III-V:N") material includes a nitrogen concentration of less than 5, 4, 3, 2, 1.5, or 1 percent (in atomic percentage) of the total atomic percent of the III-V:N material. While example embodiments are provided in the context of non-planar architectures and sub-fin leakage, other embodiments including planar transistor architectures susceptible to sub-channel leakage can also benefit from the techniques provided herein. Numerous configurations and variations will be apparent in light of this disclosure.

General Overview

Epitaxial growth of group III-V semiconductor materials (e.g., gallium arsenide and indium phosphide) on silicon (Si) substrates is one possible path for adopting such group III-V materials in current semiconductor manufacturing. Although Si (and other group IV elements, such as germanium (Ge)) is an amphoteric donor for group III-V materials and thus can act as both a donor and an acceptor for group III-V materials, for most group III-V materials, Si serves to dope the III-V material n-type. Because of the various thermal temperature transitions and processes used during semiconductor device fabrication, Si from underlying substrates can thermally diffuse into the sub-fin of a typical III-V fin-based transistor (e.g., a tri-gate transistor). The sub-channel (or sub-fin, in the case of finned architecture) is a portion below the channel region of the transistor (where the channel region is proximate to and controlled by the gate). If III-V is used for p-channel transistor applications (e.g., for a p-MOS device), having n-type doped sub-fin may be desirable, as it would block the pathway between the source and drain (S/D) regions (as such S/D regions would be p-type doped). However, in the case of III-V n-channel transistor applications (e.g., for an n-MOS device), having an unintentionally n-type doped sub-fin (e.g., via Si diffusion) would create an electrical short between the S/D regions, leading to relatively high sub-fin leakage (e.g., relative to an undoped sub-fin of the same material). Such relatively high sub-fin leakage would degrade transistor performance, making the device difficult or unable to turn off. This sub-fin leakage issue is exacerbated by the continuous scaling of transistor devices to smaller and smaller critical dimensions. One possible approach to try and remedy the sub-fin leakage would be to counter dope the sub-fin material with p-type dopants; however, such an approach leads to thermal diffusion of the counter-dopants into the channel region, thereby negatively affecting channel mobility.

Thus, and in accordance with one or more embodiments of the present disclosure, techniques are provided for forming group III-V material transistors employing nitride-based dopant diffusion barrier layers. The use of "group III-V semiconductor material" (or "group III-V material" or generally, "III-V") herein includes at least one group III element (e.g., aluminum, gallium, indium, boron, thallium) and at least one group V element (e.g., nitrogen, phosphorus, arsenic, antimony, bismuth), such as gallium arsenide (GaAs), indium gallium arsenide (InGaAs), gallium phosphide (GaP), gallium antimonide (GaSb), and indium phosphide (InP), and so forth. In some embodiments, the techniques include forming a replacement fin stack (which may also be referred to as a multilayer replacement fin) that includes multiple layers of group III-V material. In some such embodiments, the layers of the replacement fin stack may include: a channel layer (e.g., to be used in the channel region of the transistor device, and thus, the channel when the device is in an on-state); a sub-channel layer (e.g., upon which the channel layer will be formed); a dilute nitride-based dopant diffusion barrier layer, or simply, a barrier layer (e.g., to reduce or prevent undesired diffusion of substrate atoms into the sub-channel layer); and an optional nucleation layer (e.g., to 'wet' or otherwise prepare the trench bottom for the growth of other III-V material layers). Recall that, generally, the sub-channel (or sub-fin, in the case of finned architecture) is the portion of the integrated (IC) structure below the channel region of the transistor (where the channel region is proximate to and/or in contact with the gate stack). Note that the sub-channel layer as used herein is a layer that is intended to be formed in what will be the sub-fin portion below the channel region. Also note that the dilute nitride-based dopant diffusion barrier layer as variously described herein may be referred to as the nitride-based barrier layer, the dopant diffusion barrier layer, or simply, the barrier layer, for ease of reference.

In some embodiments, the techniques include forming/growing the dilute nitride-based barrier layer as a relatively thin layer of III-V material in the sub-fin region of a transistor, near the substrate/III-V material interface. Such a nitride-based barrier layer can be used to trap atoms, which may diffuse from the substrate (e.g., Si and/or Ge atoms), at vacancy sites within the III-V material. For instance in the case of forming the III-V transistor on a Si substrate, the nitrogen (N) atoms alloyed into the III-V material can trap the Si atoms as Si—N pairs at the vacancy sites. Therefore, the barrier layer can arrest atoms from the substrate (e.g., Si and/or Ge atoms) from diffusing in an undesired manner by protecting the sub-channel layer from being unintentionally doped (e.g., n-type doped) due to subsequent processing in the transistor fabrication. Further, as N atoms are relatively smaller in atomic size as compared to other III-V elements, the introduction of dilute nitride alloying does not alter the hetero-epitaxy of the primary III-V compound. For instance, N atoms have a covalent radius (measure of the size of an atom that forms part of one covalent bond) of approximately 71 picometers (μm), which can be compared to the approximate covalent radii of other III-V elements, such as Ga (122 μm), In (142 μm), As (119 μm), P (107 μm), and Sb (139 μm). In addition, by forming the barrier layer pseudomorphically (e.g., less than the critical thickness of the material above which dislocations are introduced), the lattice mismatch of the barrier layer with the sub-channel layer becomes insignificant, because such pseudomorphic growth can deter or prevent undesired dislocations from forming. In some embodiments, pseudomorphic growth of the barrier layer may include growing the layer to have a thickness (in the dimension of the main axis of the III-V multilayer stack) in the range of 5-50 nanometers (nm), or some other suitable thickness as will be apparent in light of this disclosure.

Recall that nitrogen is a group V semiconductor material (along with, for example, phosphorus, arsenic, and antimony). However, group III-nitride (III-N) material, such as gallium nitride, is generally not combined with other group III-V material (that does not include nitrogen), as such group III-N and III-V material are typically used for different applications (e.g., III-N may be used for RF applications and III-V may be used for logic applications). Thus, the use of relatively small amounts of nitrogen in III-V material that does not include nitrogen (referred to herein as dilute nitride alloying of III-V material) can be used in the techniques described herein to provide dopant diffusion barrier benefits. As will be apparent in light of this disclosure, in some embodiments, dilute nitride alloying may include alloying a III-V material that does not include nitrogen in the group V component with nitrogen (N), such that the final group III-V plus alloy of N ("III-V:N") material includes a nitrogen concentration of less than 5, 4, 3, 2, 1.5, or 1 percent (in atomic percentage) of the total atomic percent of the III-V:N material. In other words, III-V:N material can be considered as a III-V compound (that does not typically include nitrogen) having a portion of the group V component including a relatively small amount of nitrogen as a result of the dilute nitride alloying. Note that the "V" in III-V:N should not be mistaken for the element vanadium, as it is not representing that element but is instead representing the number five, just as "III" represents the number three and "IV" represents the number four, as used herein. Such III-V:N compounds may include gallium arsenide:nitride (GaAs:N), aluminum gallium arsenide:nitride (AlGaAs:N), gallium antimonide:nitride (GaSb:N), indium phosphide:nitride (InP:N), aluminum indium phosphide:nitride (AlInP:N), and gallium phosphide:nitride (GaP:N), to provide some examples. For ease of description, group III-V materials not including nitrogen that are alloyed with a dilute amount of nitrogen may be referred to as "III-$V_{1-y}N_y$," herein, as the nitrogen content will affect the amount of other group V elements in the III-V compound. Thus, in such III-$V_{1-y}N_y$ material, for the group V elements, the concentration of nitrogen is represented as y and the total concentration of other included group V elements (e.g., phosphorus, arsenic, antimony, bismuth) is 1-y. For instance, if GaAs is alloyed with dilute nitride, the resulting compound may be represented as $GaAs_{1-y}N_y$. In some embodiments, a dilute nitride alloy as used herein means that, in III-$V_{1-y}N_y$ material, y is less 0.1, 0.09, 0.08, 0.07, 0.06, 0.05, 0.04, 0.03, 0.02, 0.01, or 0.005, or less than some other suitable threshold maximum nitrogen concentration as will be apparent in light of this disclosure. In other words, the dilute nitride alloying of a III-V material may be represented as the percentage of the group V component of that III-V plus N alloy material. Therefore, for ease of reference, III-V material including a dilute nitride alloy may be referred to herein as III-V:N or III-$V_{1-y}N_y$ material, for example.

In some embodiments, the barrier layer may include the material of the sub-channel layer, with the addition of a dilute nitride alloy, as will be apparent in light of this disclosure. For instance, the following are example sub-channel layer material/barrier layer material sets: GaAs/GaAs:N, GaP/GaP:N, InP/InP:N, and GaSb/GaSb:N. In some embodiments, the channel layer may include III-V material having a smaller bandgap relative to the III-V material of the sub-channel layer. For instance, the channel layer may include InGaAs, indium arsenide (InAs), or indium antimonide (InSb), to provide some examples, as these example materials have relatively low bandgaps compared to other III-V materials. In some embodiments, the percentage (in atomic percent) of N in the dopant diffusion barrier layer may be selected based on, for example: how effectively the barrier layer material can trap atoms (e.g., Si atoms) from the substrate that could potentially diffuse upward into the remainder of the III-V stack of layers; whether the barrier layer material would alter the heteroepitaxy of the existing III-V stack of materials; and/or whether the barrier layer material causes a barrier in the valence band for hole flow from the channel to the substrate resulting in a floating body which would degrade gate-induced-drain-leakage (GIDL) and buried-insulator-induced-barrier lowering (BIBL).

Employing a nitride-based dopant diffusion barrier layer as variously described herein can provide a multitude of benefits and improve transistor performance, as will be apparent in light of this disclosure. Such benefits can even be realized in embodiments where at least a portion of the sub-fin (which may or may not include the barrier layer) is removed, such as in the case of fabricating nanowire (or nanoribbon or GAA) transistors, as the barrier layer can protect the sub-fin and channel region from unintentional/undesired dopant diffusion until the sub-fin is released to fabricate the one or more nanowires (or nanoribbons) in the channel region, as will be apparent in light of this disclosure. In addition, although the techniques variously described herein primarily benefit n-channel devices (e.g., n-MOS) as the barrier layer may be employed to reduce/prevent dopant diffusion of group IV atoms (e.g., Si and/or Ge atoms) from diffusing from the substrate up into the sub-channel or sub-fin portion of the structure, as can be understood based on this disclosure, the techniques can also benefit p-channel devices (e.g., p-MOS), due to group IV elements (e.g., Si, Ge) being amphoteric donors for III-V material, for example. Numerous other benefits of the techniques described herein will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) having a transistor that includes a barrier layer a nitride-based dopant diffusion barrier layer between the channel region of the transistor and the IC substrate. In some such embodiments, the barrier layer may include III-$V_{1-y}N_y$ material where the nitride alloy is dilute, such that y is less than 0.1, 0.05, or 0.03 (in other words, where N represents 5, 2.5 or 1.5 percent, respectively, of the total atomic percentage of the material), for example. In some embodiments, the techniques and IC structures described herein may be detected based on the benefits they provide. For instance, in some embodiments, the use of a nitride-based dopant diffusion barrier layer may eliminate or greatly reduce off-state leakage current, eliminate or greatly reduce unintentional/undesired contamination of the sub-channel (or sub-fin) and channel region, and/or provide any other benefits as will be apparent in light of this disclosure. Numerous configurations and variations will be apparent in light of this disclosure.

Methodology and Architecture

FIGS. 1A-M illustrate example integrated circuit (IC) structures resulting from a method configured to form transistors employing nitride-based dopant diffusion barrier layers, in accordance with some embodiments of the present disclosure. As will be apparent in light of this disclosure, in some embodiments, the method includes forming a multi-layer fin structure of multiple III-V layers including, from the substrate up, an optional nucleation layer, a barrier layer, a sub-channel layer, and a channel layer, each of which will be described in more detail herein. FIGS. 1A-H and 1M show perspective views of the IC structures, for ease of illustration. Note that FIGS. 1I-L are cross-sectional views taken along plane A of FIG. 1H, in accordance with some embodiments. Also note that FIGS. 1C' and 1C" illustrate example alternative trench bottom shapes that may be formed, in accordance with some embodiments. Further note that FIGS. 1D', 1J', 1K', and 1L' are provided to illustrate alternative multilayer fin structures that may be used to form a gate-all-around (GAA) transistor including two nanowires, in accordance with some embodiments.

The structures of FIGS. 1A-L are primarily depicted and described herein in the context of forming non-planar transistor configurations, such as finned configurations (e.g., FinFET or tri-gate) and nanowire (or nanoribbon or gate-all-around) configuration transistors. However, the techniques can be used to form transistors of any suitable geometry or configuration, depending on the end use or target application. Various example transistors that can benefit from the techniques described herein include, but are not limited to, field-effect transistors (FETs), metal-oxide-semiconductor FETs (MOSFETs), tunnel-FETs (TFETs), planar configuration transistors, finned configuration transistors (e.g., FinFET, tri-gate, double-gate), and nanowire (or nanoribbon or gate-all-around) configuration transistors. In addition, the techniques can be used to benefit p-type devices (e.g., p-MOS and p-TFET) and/or n-type devices (e.g., n-MOS and n-TFET). Further, the techniques may be used to form complementary MOS (CMOS) and/or complementary TFET (CTFET) transistors/devices/circuits, where either or both of the included p-type and n-type transistors may include nitride-based dopant diffusion barrier layers as variously described herein. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

FIG. 1A illustrates an example IC structure including substrate 100 having fins 102 and 104 formed therefrom, in accordance with an embodiment. In some embodiments, fins 102 and 104 may be formed using any suitable techniques, such as one or more patterning and etching processes, for example. In some cases, the process of forming fins 102 and 104 may be referred to as shallow trench recess (STR), for example. In this example embodiment, fins 102 and 104 are formed from substrate 100, but in other embodiments, fins may be formed on substrate 100 (e.g., using any suitable deposition/growth and patterning techniques). FIG. 1A also shows trench 115 formed between fins 102 and 104, in this example embodiment. In some embodiments, the fins may be formed to have varying widths Fw (dimension in the X-axis direction) and heights Fh (dimension in the Y-axis direction). For example, in an aspect ratio trapping (ART) scheme, the fins may be formed to have particular height Fh to width Fw ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h:w) of the fins may be greater than 1, such as greater than 1.5, 2, 3, 4, 5, 10, 15 or 20, or any other suitable threshold ratio as will be apparent in light of this disclosure. Note that although fins 102 and 104 are shown having the same heights Fh and widths Fw in this example embodiment, the present disclosure is not intended to be so limited. For instance, in some embodiments they may have different widths and/or heights. Also note that although only two fins are shown in the example IC structure of FIG. 1A for ease of illustration, any number of fins may be formed, such as one, five, ten, hundreds, thousands, millions, and so forth, as the devices to be formed using the fins can be on the nanotechnology scale, as can be understood based on this disclosure.

In some embodiments, substrate 100 may include: a bulk substrate including group IV semiconductor material, such as silicon (Si), germanium (Ge), silicon germanium (SiGe), or silicon carbide (SiC), and/or any other suitable material(s); an X on insulator (XOI) structure where X includes group IV material and the insulator material is an oxide material or dielectric material or some other electrically insulating material; or some other suitable multilayer structure where the top layer includes group IV material. The use of "group IV semiconductor material" (or "group IV material" or generally, "IV") herein includes at least one group IV element (e.g., silicon, germanium, carbon, tin, lead), such as Si, Ge, SiGe, SiC, and so forth. Also recall that the use of "group III-V semiconductor material" (or "group III-V material" or generally, "III-V") herein includes at least one group III element (e.g., aluminum, gallium, indium, boron, thallium) and at least one group V element (e.g., nitrogen, phosphorus, arsenic, antimony, bismuth), such as gallium arsenide (GaAs), indium gallium arsenide (InGaAs), gallium phosphide (GaP), gallium antimonide (GaSb), and indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. In some embodiments, substrate 100 may include a surface crystalline orientation described by a Miller Index of <100>, <110>, or <111>, or its equivalents, as will be apparent in light of this disclosure. The original thickness or height of substrate 100 (dimension in the Y-axis direction) may be in the range of 50 to 950 microns, for example, or some other suitable thickness or height, and such original height may be reduced as a result of processing in, on and/or above the substrate 100. In some embodiments, substrate 100 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, and/or any other suitable semiconductor or IC devices, depending on the end use or target application. Accordingly, in some embodiments, the transistor structures described herein may be included in a system-on-chip (SoC) application, as will be apparent in light of this disclosure.

Figure 1B:
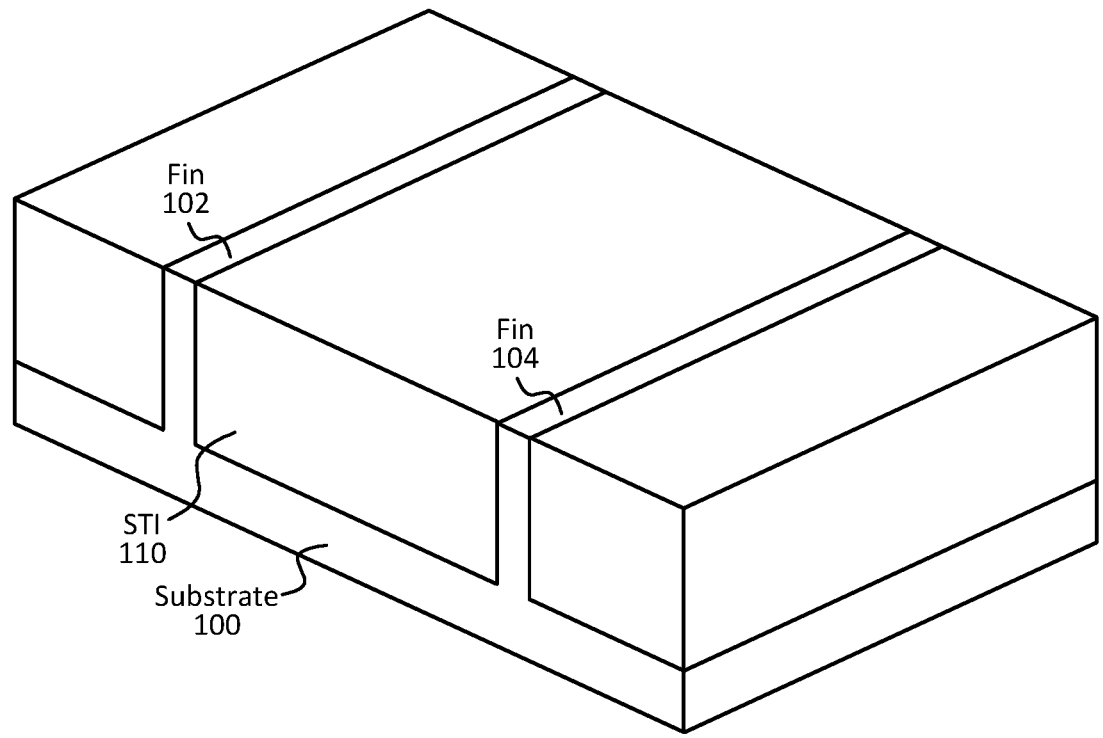

FIG. 1B illustrates an example IC structure formed after shallow trench isolation (STI) 110 processing has been performed in trenches 115 of the structure of FIG. 1A, in accordance with an embodiment. In some embodiments, STI processing may include any suitable techniques, such as deposition of the STI material followed by an optional planarization or polish process, for example. Any suitable deposition process may be used for the STI layer 110 deposition and the STI material may be selected based on the material of substrate 100 (e.g., to provide appropriate isolation and/or passivation), in some embodiments. In some embodiments, STI layer 110 may include one or more oxides, nitrides, dielectrics, or other suitable electrically insulating material. For example, in the case of a Si substrate 100, STI material 110 may selected to be silicon dioxide or silicon nitride.

Figure 1C:
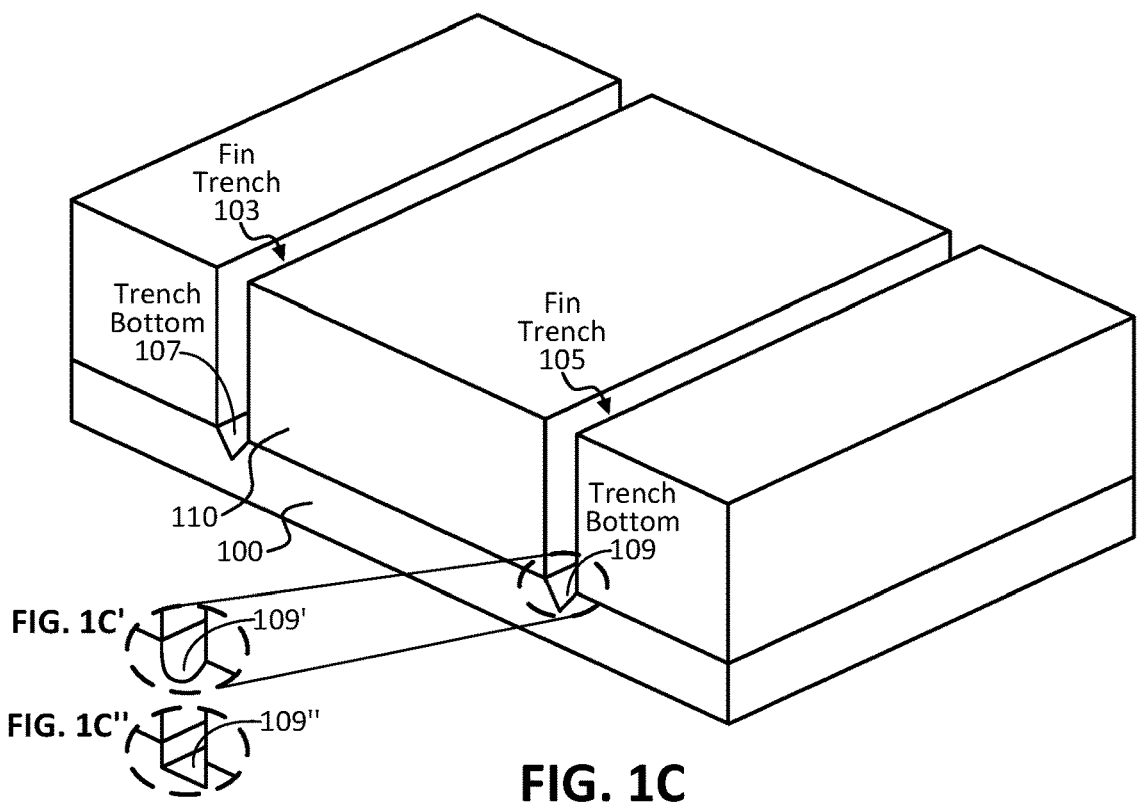

FIG. 1C illustrates an example IC structure formed after fins 102 and 104 have been etched out from the structure of FIG. 1B to form fin trenches 103 and 105, respectively, in accordance with an embodiment. In some embodiments, any suitable wet and/or dry etch processes may be used to form fin trenches 103 and 105, for example. In some such embodiments, the fin trenches 103 and 105 can include a desired or controlled size and shape, based on the size and shape of fins 102 and 104 and/or based on the conditions used during the etch to form trenches 103 and 105, for example. In the example IC structure of FIG. 1C, the bottom of the trenches 107 and 109 include faceting as shown, which can facilitate growth of subsequently deposited materials, as will be described in more detail herein. In this example embodiment, the faceting at the bottom of trenches 107 and 109 is shown as a {111} faceting, which includes a triangular shape at the bottom of the trench. In such an embodiment, the {111} faceting at the bottom of the trench may be used to facilitate the growth of the group III-V epitaxial materials, as will be described in more detail below. In some embodiments, other suitable trench bottom geometry may be formed, such as a curved faceting 109' illustrated in FIG. 1C' or a flat bottom 109" illustrated in FIG. 1C", to provide some additional examples. In some embodiments, the geometry at trench bottoms 107 and 109 may be selected based on selected processing techniques and/or conditions, for example.

Figure 1D:
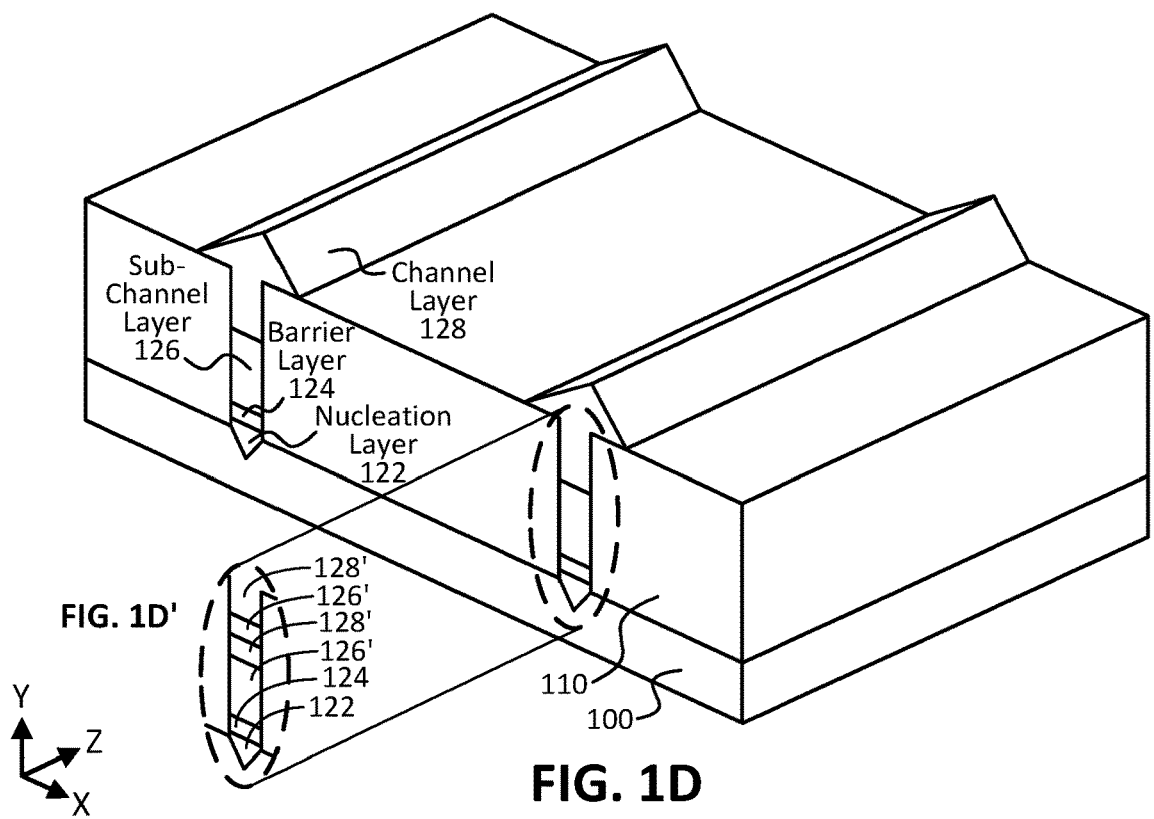

FIG. 1D illustrates an example IC structure formed after multiple material layers have been deposited in fin trenches 103 and 105 of the structure of FIG. 1C to form a multilayer replacement fin stack, in accordance with an embodiment. In some embodiments, the layers of the multilayer replacement fin stack may be formed using metal-organic chemical vapor deposition (MOCVD), molecular-beam epitaxy (MBE), chemical vapor deposition (CVD), atomic layer deposition (ALD), physical vapor deposition (PVD), and/or any other suitable process as will be apparent in light of this disclosure. In this example embodiment, the layers include, going from the substrate up, optional nucleation layer 122, barrier layer 124, sub-channel layer 126, and channel layer 128. Further, in this example embodiment, all four of the layers 122, 124, 126, and 128 include group III-V semiconductor material; however, the present disclosure is not intended to be so limited to only four layers or all layers in the stack including group III-V material, unless otherwise stated. In some embodiments, nucleation layer 122 is optional (and thus, not present), as it may be deposited to wet the trench bottoms 103 and 105 (e.g., to wet the {111} faceted trenches), for instance. Note that the use of group IV or group III-V to describe the material of a layer, feature, or structure is used to indicate that the layer, feature, or structure includes the corresponding group IV or group III-V material, but may also include other materials, such as one or more dopant materials, as will be apparent in light of the present disclosure.

Recall that in some embodiments, fin trenches 103 and 105 may be sufficiently narrow and/or sufficiently deep (e.g., with a height:width ratio of at least 1, 1.5, or 2) for the deposition or epitaxial growth of the multi-layer structure to employ an aspect ratio trapping (ART) scheme to contain lattice defects (e.g., misfit dislocations, stacking faults, and so forth) to the very bottom of the trench. In some such embodiments, the use of narrow trenches 103 and 105 to employ an ART scheme can account for the lattice mismatch of the materials deposited therein. Further, in some such embodiments, employing an ART scheme minimizes or eliminates the lattice defects in the channel region of the transistor being formed using the multilayer replacement fin stack, as can be understood based on this disclosure. In some embodiments, the deposition may be selective, such that it only or primarily (e.g., where at least 60, 70, 80, 90, or 95% of the material) grows in fin trenches 103 and 105, for example. In some such embodiments, some of the material may grow in other areas, such as on STI 110, for example.

Figure 1E:
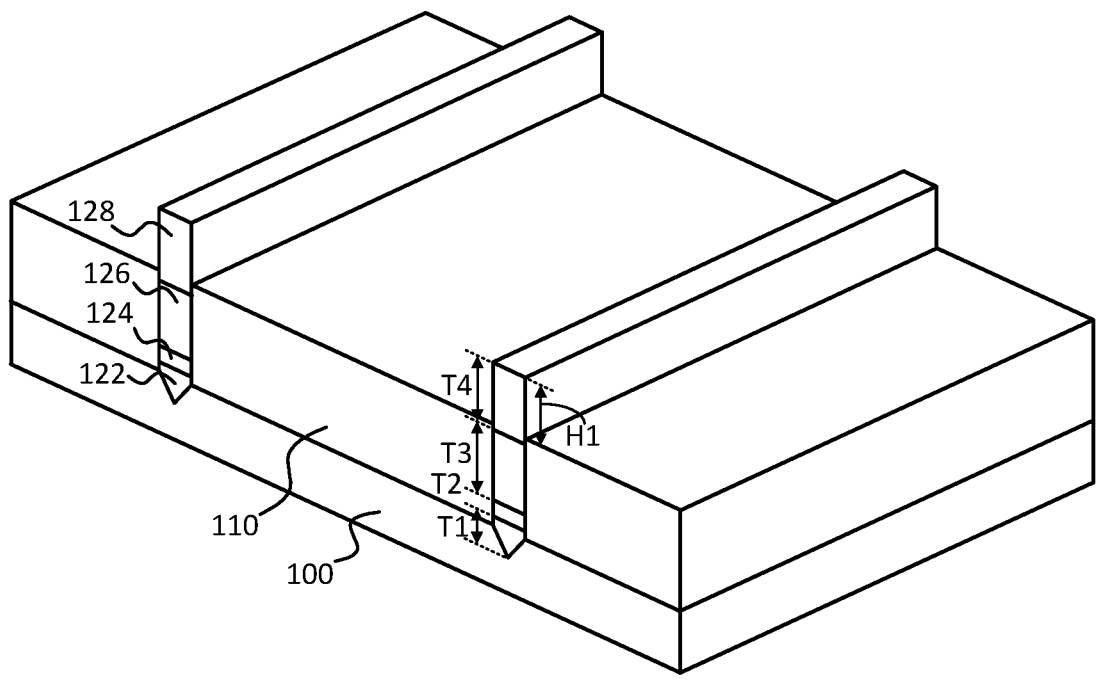

Optional nucleation layer 122, in some embodiments, may be present to 'wet' or otherwise prepare the trench bottom (e.g., trench bottoms 107, 109) for the growth of other III-V material layers. In some embodiments, nucleation layer 122 (where present), may include any suitable material, such as III-V material, for example. In some embodiments, nucleation layer 122 (where present) may include the same III-V material of sub-channel layer 126, such as indium aluminum arsenide (InAlAs), indium phosphide (InP), gallium phosphide (GaP), gallium arsenide (GaAs), gallium arsenide antimonide (GaAsSb), aluminum arsenide antimonide (AlAsSb), indium aluminum gallium arsenide (InAlGaAs), or indium aluminum gallium phosphide (InAlGaP), to provide some examples. In some embodiments, nucleation layer 122 (where present) may include similar material as barrier layer 124, except that barrier layer would include dilute nitride, as can be understood based on this disclosure. In some embodiments, nucleation layer 122 (where present) may include a thickness T1 as illustrated in FIG. 1E (dimension in the Y-axis direction) in the range of 2-60 nm (e.g., 20-40 nm), or some other suitable thickness as will be apparent in light of this disclosure. Note that the top plane of nucleation layer 122 is above the bottom plane of STI layer 110 in FIG. 1D, such that nucleation layer 122 is the only layer in the multilayer fin stack that is in physical contact with substrate 100, in this example embodiment. Also note that in embodiments where optional nucleation layer 122 is not present, barrier layer 124 may be the first layer deposited in fin trenches 103 and 105, such that barrier layer is in physical contact with substrate 100, for example.

Barrier layer 124, in some embodiments, may be present to reduce or prevent undesired diffusion of group IV atoms (e.g., Si and/or Ge atoms) upward into the remainder of the multilayer fin stack, such as into sub-channel layer 126 and/or channel layer 128, for example. In other words, barrier layer 124 may be present to prevent the diffusion of atoms from the substrate material into the sub-channel (or sub-fin) portion and/or channel region of a transistor, where the channel region is proximate to and/or in contact with the gate stack in the resulting transistor device (and thus, includes the channel which is controlled by the gate of the transistor device) and the sub-channel (or sub-fin, in the case of finned architecture) portion is below the channel region, between the channel region and substrate 100, such as the portion that is proximate to STI layer 110 in the end structure, as will be apparent in light of this disclosure. In some embodiments, barrier layer 124 may include any suitable material, such as III-V material including dilute nitride alloying, for example. Dilute nitride alloying, in some embodiments, may include alloying a III-V material with nitrogen such that the final group III-V plus alloy of N ("III-V:N") material includes a nitrogen concentration of less than 5, 4, 3, 2, 1.5, or 1 percent (in atomic percentage) in the III-V material. Such III-V:N compounds may include gallium arsenide:nitride (GaAs:N), aluminum gallium arsenide:nitride (AlGaAs:N), gallium antimonide:nitride (GaSb:N), indium phosphide:nitride (InP:N), aluminum indium phosphide:nitride (AlInP:N), and gallium phosphide:nitride (GaP:N), to provide some examples. In some embodiments, the dilute nitride-based alloying may be performed by grading nitrogen into the III-V material of layer 124, such that there is not a distinct interface or there is only a semi-distinct interface between layers 124 and 126 (and between layers 122 and 124, where 122 is present), or the dilute nitride-based alloying may be performed by forming distinct layer including nitrogen content for barrier layer 124 (e.g., by stopping the material growth and re-starting it to introduce the nitrogen content, and stopping it again before continuing with growing layer 126). Thus, the dilute nitride-based alloying may be consistent throughout layer 124 or graded in some fashion such that the nitrogen concentration is higher in a portion of the layer than another portion of the layer.

In some embodiments, the barrier layer 124 can include the same III-V material of the sub-channel layer 126, with the addition of dilute nitride alloying. Accordingly, where sub-channel layer 126 and optional nucleation layer 122 is present and includes the same III-V material, barrier layer 124 would also include the same material as nucleation layer 122, in some such embodiments. For instance, the following are sub-channel layer 126/barrier layer 124 material sets in some such embodiments: GaAs/GaAs:N, GaP/GaP:N, InP/InP:N, and GaSb/GaSb:N, to provide some examples. Therefore in some embodiments, the dilute nitride-based alloying as variously described herein may be introduced via grading, such as introducing nitrogen into the III-V material used for the sub-channel layer 126 (and, in some instances, for the optional nucleation layer 122, where present) and then removing it when growing layer 126 (e.g., via MOCVD). In some embodiments, the III-V:N material may include aluminum and/or carbon to assist with blocking dopant diffusion, for example. For instance, in some embodiments, the III-V:N material may include carbon alloying in a percentage of up to 2, 1.5, 1, or 0.5 percent of the total atomic percentage of the material of barrier layer 124, or some other suitable amount as will be apparent in light of this disclosure. In embodiments where the III-V:N material includes aluminum in addition to other group IV materials (e.g., gallium, indium, boron, thallium), the material may include InAlAs:N, AsAlSb:N, InAlGaAs:N, and InAlGaP:N, to provide some examples.

For ease of description, group III-V materials not including nitrogen that are alloyed with a dilute amount of nitrogen may be referred to as "III-$V_{1-y}N_y$," herein, as the nitrogen content will affect the amount of other group V elements in the III-V compound. Thus, in such III-$V_{1-y}N_y$ material, for the group V elements, the concentration of nitrogen is represented as y and the total concentration of other included group V elements (e.g., phosphorus, arsenic, antimony, bismuth) is 1-y. For instance, if GaAs is alloyed with dilute nitride, the resulting compound may be represented as GaAs$_{1-y}N_y$, and if y is 0.02 (such that nitrogen is 1% of the total atomic percentage of the material), then 1-y would be 0.98 (such that arsenic is 49% of the total atomic percentage of the material), and for completeness of description, gallium would represent the other 50% of the total atomic percentage of the material. In another example case, if InAlGaP is alloyed with dilute nitride, the resulting compound could be represented by $In_{1-z}Al_zGa_{1-x-y}P_xN_y$, for instance, where z would be less than 1 and x plus y would be less than 1, and where the total concentration in the non-N group V materials would still be 1-y (1-x-y plus x). In some embodiments, dilute nitride alloying as used herein means that, in III-$V_{1-y}N_y$ material, y is less 0.1, 0.09, 0.08, 0.07, 0.06, 0.05, 0.04, 0.03, 0.02, 0.01, or 0.005, or less than some other suitable threshold maximum nitrogen concentration as will be apparent in light of this disclosure. In other words, using equivalent percentages of the total atomic percentage of the total III-V:N material, in some such embodiments, the dilute nitride alloying would be less than 5, 4.5, 4, 3.5, 3, 2.5, 2, 1.5, 1, 0.5, or 0.25 percent, respectively, or less than some other suitable threshold maximum nitrogen percentage as will be apparent in light of this disclosure.

In some embodiments, the atomic percent of N in the dilute nitride-based dopant diffusion barrier layer 124 affects the bandgap and band alignment relative to sub-channel layer 126, for example. Thus, the atomic percent of N in barrier layer 124 can be chosen, in some example embodiments, such that it: does not alter the hetero-epitaxy of the sub-channel portion; effectively traps group IV substrate atoms (e.g., Si and/or Ge atoms) by forming group IV-N pairs at the vacancy sites in the barrier layer 124; and does not create a barrier in the valence band which could obstruct the hole flow from the channel to the substrate. In some embodiments, barrier layer 124 may include a thickness T2 as illustrated in FIG. 1E (dimension in the Y-axis direction) in the range of 2-50 nm (e.g., 5-30 nm), or some other suitable thickness as will be apparent in light of this disclosure. In some embodiments, barrier layer 124 may be formed pseudomorphically, such that it has a lower thickness than the critical thickness of the material of that layer 124 (e.g., less than the critical thickness beyond which dislocations are introduced). Further, any lattice mismatch introduced by the dilute nitride-based alloying of the material in barrier layer 124 can become inconsequential, having minimal to no impact, when barrier layer is grown as a pseudomorphic layer, for example.

Sub-channel layer 126, in some embodiments, may be present in the multilayer fin stack to provide a buffer to channel layer 128 and thereby fill up the sub-channel portion of the stack (e.g., the portion to be located below the channel region of the resulting transistor device). In some embodiments, sub-channel layer 126 may include any suitable material, such as III-V material, for example. In some such embodiments, sub-channel layer 126 may include III-V material having a higher bandgap relative to the bandgap of the III-V material included in channel layer 128, for example. For instance, sub-channel layer 126 may include InAlAs, InP, GaP, GaAs, GaAsSb, AlAsSb, InAlGaAs, or InAlGaP, to provide some examples. In some embodiments, the III-V material of sub-channel layer 126 may be selected based on the III-V material having a bandgap greater than 1, 1.25, 1.5, 1.75, 2, or 2.25 eV, for example, or some other suitable threshold minimum value as will be apparent in light of this disclosure. As can be understood based on this disclosure, both barrier layer 124 and sub-channel layer 126 are grown in what will be the sub-channel (or sub-fin) portion of the transistor device, but in the example embodiment of FIG. 1D, the barrier layer 124 is formed closer to the substrate/III-V material stack interface than the sub-channel layer 126. In other words, in this example embodiment, sub-channel layer 126 is formed closer to channel layer 128 (which be used to form the channel region) than barrier layer 124. However, the present disclosure need not be so limited unless otherwise stated. In some embodiments, sub-channel layer 126 may include a thickness T3 as illustrated in FIG. 1E (dimension in the Y-axis direction) in the range of 50-400 nm (e.g., 150-250 nm), or some other suitable thickness as will be apparent in light of this disclosure.

Channel layer 128, in some embodiments, may be present in the multilayer fin stack to be used, at least in part, in the channel region of a transistor device formed using the techniques described herein. In some embodiments, channel layer 128 may include any suitable material, such as III-V material, for example. In some such embodiments, channel layer 128 may include III-V material having a smaller bandgap relative to the bandgap of the III-V material included in sub-channel layer 126, for example. For instance, channel layer 128 may include InGaAs, InAs, or InSb, to provide some examples. In some embodiments, channel layer 128 may include indium (In). In some embodiments, the III-V material of channel layer 128 may be selected based on the III-V material having a bandgap less than 0.25, 0.5, 0.75, 1, 1.25, or 1.5 eV, for example, or some other suitable threshold maximum value as will be apparent in light of this disclosure. In some embodiments, any of layers 122, 124, 126, and/or 128 may be doped with any suitable dopant (e.g., suitable n-type and/or p-type dopants), as desired. In some embodiments, the channel layer 128 material may be formed to be undoped or nominally undoped (e.g., electrically neutral/intrinsic and/or doped with less than 5E17 atoms per cubic centimeter of carriers), for example. However, in other embodiments, channel layer 128 may be p-type doped with suitable dopants, such as in the case of some n-channel devices (e.g., n-MOS). In some embodiments, channel layer 128 may include a thickness T4 as illustrated in FIG. 1E (dimension in the Y-axis direction) in the range of 10-100 nm (e.g., 30-60 nm), or some other suitable thickness as will be apparent in light of this disclosure.

In some embodiments, one or more of the layers included in the fin stack (e.g., one or more of layers 122, 124, 126, 128) may include grading (e.g., increasing and/or decreasing) the content of one or more materials in the layer. Further, in some embodiments, one or more of the layers included in the fin stack may have a multi-layer structure including at least two material layers, depending on the end use or target application. In some embodiments, the III-V multilayer stack may include additional layers, such as in the case of fabricating nanowire or GAA transistors including multiple nanowires, for example. Further, in some such embodiments, sacrificial material layers may be formed between two or more III-V material layers to be used for nanowires in the channel region of a transistor, where the sacrificial material can be removed later in the process flow using a selective etch process. For example, FIG. 1D' illustrates an alternative stack of III-V materials that may be formed in the fin trenches 103 and 105, in accordance with an embodiment. As can be seen in FIG. 1D', the stack includes nucleation layer 122 and barrier layer 124, as previously described, but also includes two sacrificial sub-channel material layers 126' and two channel layers 128'. The previous relevant disclosure with respect to layers 126 and 128 are equally applicable to layers 126' and 128', respectively. As can be understood based on this disclosure, the material of layers 126' and 128' may be selected such that layers 126' may be removed later in the process flow via selective etch processing, whereby the selective etch may be a wet etch that uses an etchant that removes the material of layers 126' at a faster rate than the rate at which the etchant removes material of layers 128' (e.g., at least 2, 3, 4, 5, 10, 15, 20, 50, or 100 times faster). Thus, such a selective etch process can leave layers 128' remaining to be used for a nanowire (or nanoribbon or GAA) transistor configuration, as can be understood based on this disclosure. As can also be understood, if more nanowires were desired, the stack may include additional 126'/128' layer pairings, for example. Numerous variations on the stack of III-V layers will be apparent in light of this disclosure.

FIG. 1E illustrates an example IC structure formed after the structure of FIG. 1D has been polished/planarized and the material of STI layer 110 has been recessed, in accordance with an embodiment. In some embodiments, the polish and/or planarization process and the recessing of the STI layer may be performed using any suitable techniques. In this example embodiment, STI layer 110 was recessed such that the channel layer 128 has a remainder height of H1 exuding from the top plane of STI layer 110, as shown in FIG. 1E. As is also shown, the recess stopped prior to getting to the interface of layers 126 and 128, in this example embodiment. In other words, the recess stopped prior to having any of sub-channel layer 126 exposed; however, in other embodiments, the STI layer 110 may be recessed to a different depth, for example. In some embodiments, it may be desired to stop the recess such that only channel layer 128 exudes from the top plane of STI layer 110, such that the remainder of the III-V multilayer stack (e.g., layers 122, 124, 126, and in some cases, a portion of layer 128) remain in the sub-channel (or sub-fin) region. As can be understood based on this disclosure, the portion of channel layer 128 that exudes above the top plane of STI layer 110 and has a height H1 as shown in FIG. 1E may be the portion used for the channel region (e.g., where the active channel would reside) of a resulting finned transistor, such as a tri-gate, FinFET, or double-gate transistor. In some embodiments, the height H1 (dimension in the Y-axis direction) of that portion of channel layer 128 may be in the range of 10-100 nm (e.g., 20-50 nm), or some other suitable thickness as will be apparent in light of this disclosure.

Figure 1F:
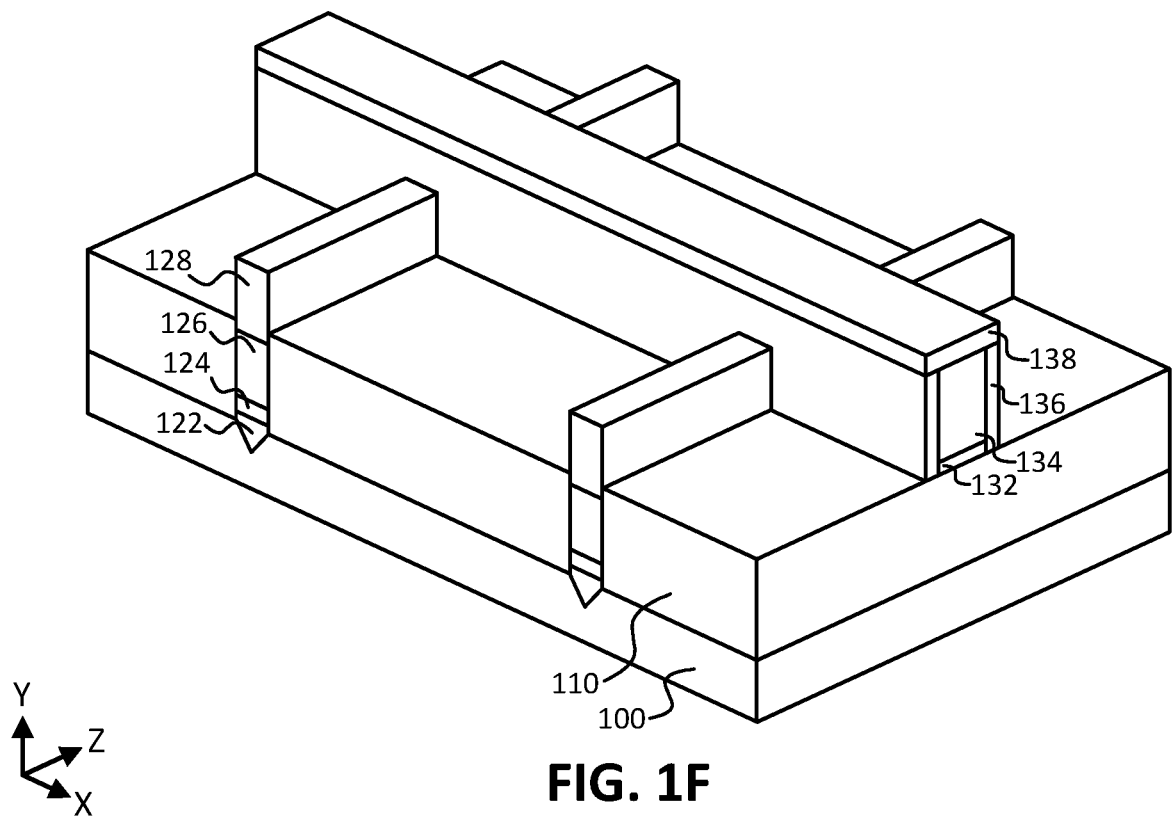

FIG. 1F illustrates an example IC structure formed after a dummy gate stack has been formed on the structure of FIG. 1E, in accordance with an embodiment. In this example embodiment, dummy gate dielectric layer 132 and dummy gate 134 include sacrificial material (e.g., dummy polysilicon for the gate 134) to be later removed and replaced in a replacement gate process in, for example, a gate last process flow. However, in some embodiments, the process flow may include a gate first process flow (also called an up-front hi-k gate flow), whereby the final gate structure is formed at this stage instead of a dummy gate. Use of a dummy gate can allow for subsequent processing in the channel region, such as to form one or more nanowires as will be described in more detail below; however, use of such a dummy gate and a gate last process flow need not be required, such as in the fabrication of finned and planar transistors, for example. In some embodiments, formation of the dummy gate stack may be performed using any suitable techniques, such as depositing the dummy gate dielectric layer 132 and dummy gate (also referred to as dummy gate electrode) layer 134, patterning the dummy layers 132 and 134 into a dummy gate stack, depositing gate spacer material, and performing a spacer etch to form spacers 136 on either side of the dummy gate stack, shown in FIG. 1F, for example. Spacers 136 (also referred to as gate spacers or sidewall spacers) can help determine the channel length and can also help with replacement gate processes, for example. As can be understood based on this disclosure, the dummy gate stack (and spacers 136) help define the channel region and source/drain (S/D) regions of each fin, where the channel region is below the dummy gate stack (as it will be located below the final gate stack), and the S/D regions are on either side of the dummy gate stack. Spacers 136 may include any suitable material, such as any suitable electrical insulator, dielectric, oxide (e.g., silicon oxide), and/or nitride (e.g., silicon nitride) material, as will be apparent in light of this disclosure. Recall that, the techniques described herein need not include forming a dummy gate stack, such that a final gate stack may be formed in the first instance. The example IC structure in this embodiment also includes hardmask 138 over the gate stack, which may be included to protect the dummy gate stack during subsequent processing, for example.

Figure 1G:
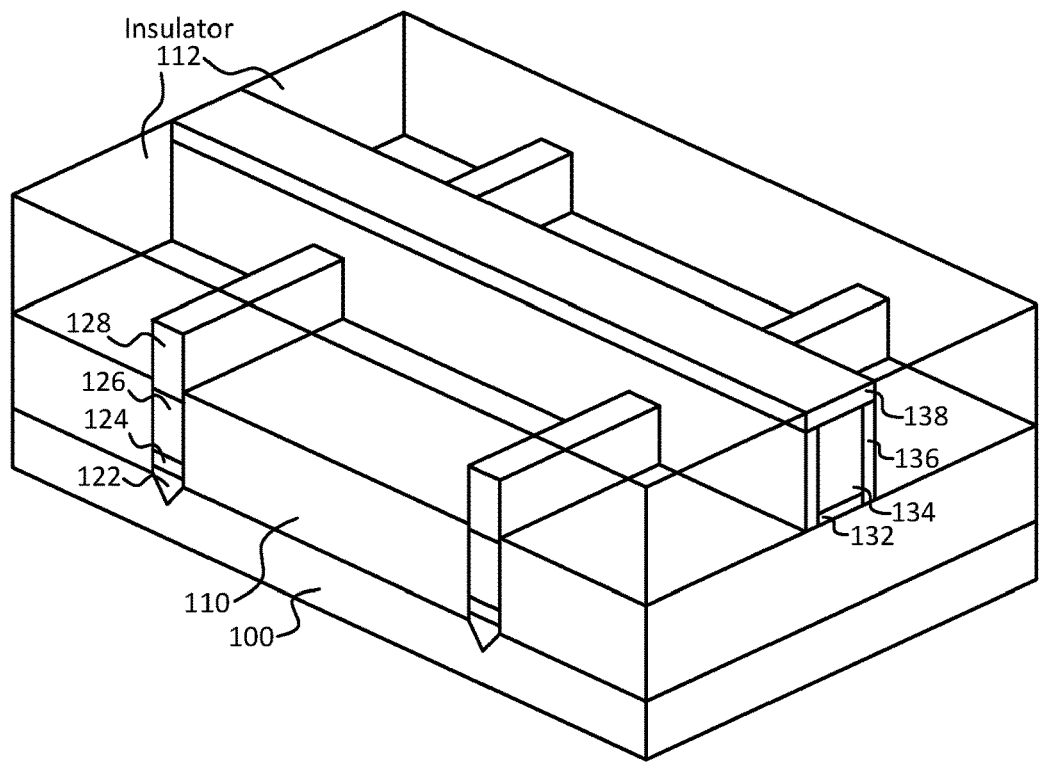

FIG. 1G illustrates an example IC structure formed after a layer of insulator material 112 has been formed on the structure of FIG. 1F, in accordance with an embodiment. In some embodiments, feature 112 may be referred to as an interlayer dielectric (ILD) layer. Note that, in this example embodiment, insulator material 112 is illustrated as transparent to allow for underlying features to be seen. In some embodiments, the insulator material 112 may include a dielectric material, such as silicon dioxide, or some other suitable electrically insulating material, for example. In some embodiments, following deposition of the insulator material 112, a polish and/or planarization process may be performed to produce the example IC structure of FIG. 1G.

Figure 1H:
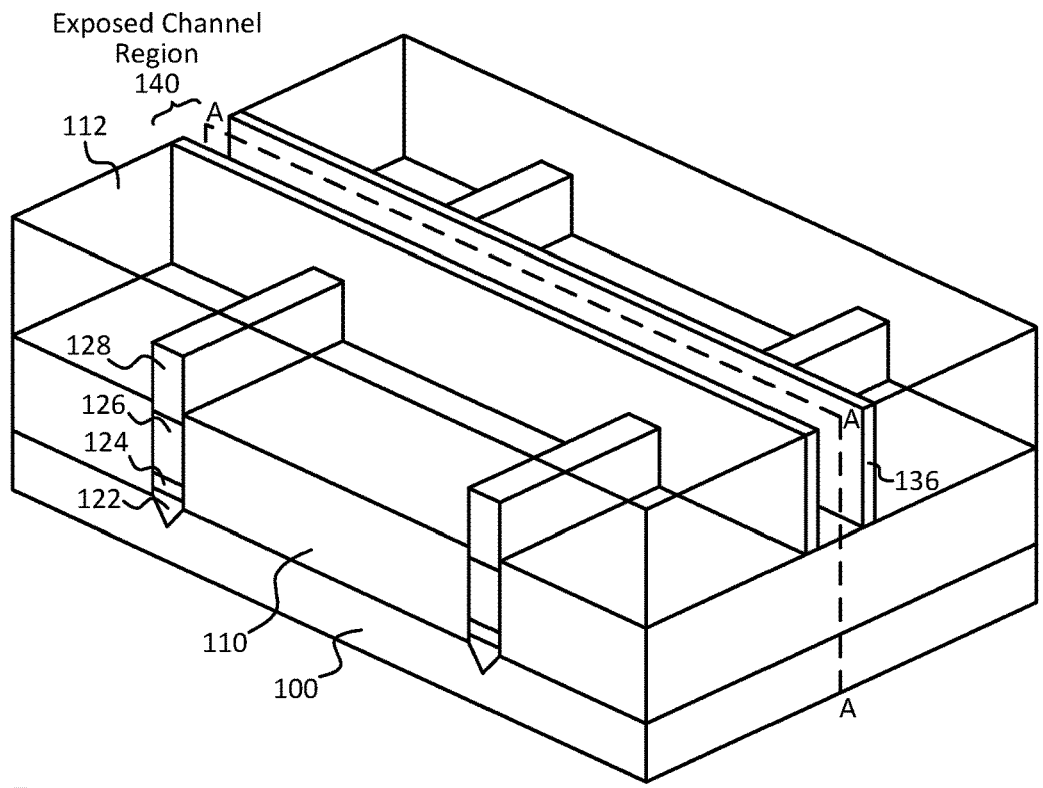

FIG. 1H illustrates an example IC structure formed after the dummy gate stack (including dummy gate dielectric layer 132 and dummy gate 134) of FIG. 1G have been removed to expose the channel region, in accordance with an embodiment. The exposed channel region is indicated as 140 in the figures. In some embodiments, removing the dummy gate stack may include first removing hardmask layer 138 and then removing the dummy gate stack (layers 134 and 132, in this example case) using any suitable techniques, such as etches, polishes, and/or cleaning processes, for example. In some embodiments, source and drain (S/D) region processing may be performed prior to performing the final gate stack processing to be described below. However, in this example embodiment, the S/D region processing is performed after, as will be described with reference to FIG. 1M. The A plane in FIG. 1H is used to indicate the cross-sectional views of FIGS. 1I-L, as will be described in more detail below.

Figure 1I:
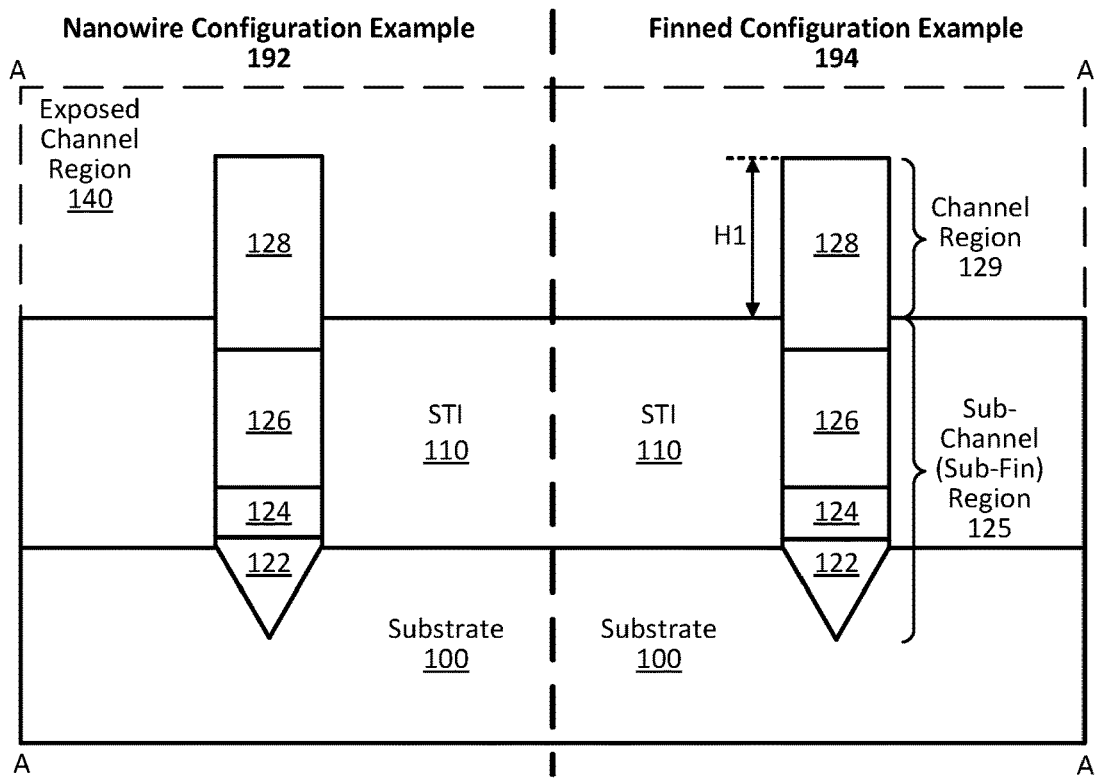

FIGS. 1I-L illustrate cross-sectional views taken along plane A of FIG. 1H, showing example IC structures formed during channel region and gate stack processing, in accordance with some embodiments. The cross-sectional views of FIGS. 1I-L illustrate processing (continuing from the structure of FIG. 1H) for both nanowire transistor configuration examples 192, shown on the left side of example IC structures of FIGS. 1I-L, and a finned transistor configuration example 194, shown on the right side of the example IC structures of FIGS. 1I-L, where the two sides are separated by a dashed line. Note that the present disclosure is not intended to be limited to only those two configurations and that the techniques described herein can be used to benefit other transistor configurations, such as planar transistors, for example. As shown in FIG. 1I, the structure includes the same structure as that of FIG. 1H, except shown in a different view to assist in illustrating subsequent processing. Therefore, the height H1 of the portion of channel layer 128 that exudes above the top plane of STI layer 110 is still the same (or similar, depending on any material that may have been removed when removing the dummy gate, for example) as the height H1 shown in FIG. 1E. As is also shown in FIG. 1I, the channel region 129 and sub-channel (or sub-fin) region 125 are indicated to show the different portions of the right multilayer replacement stack.

Figure 1J:
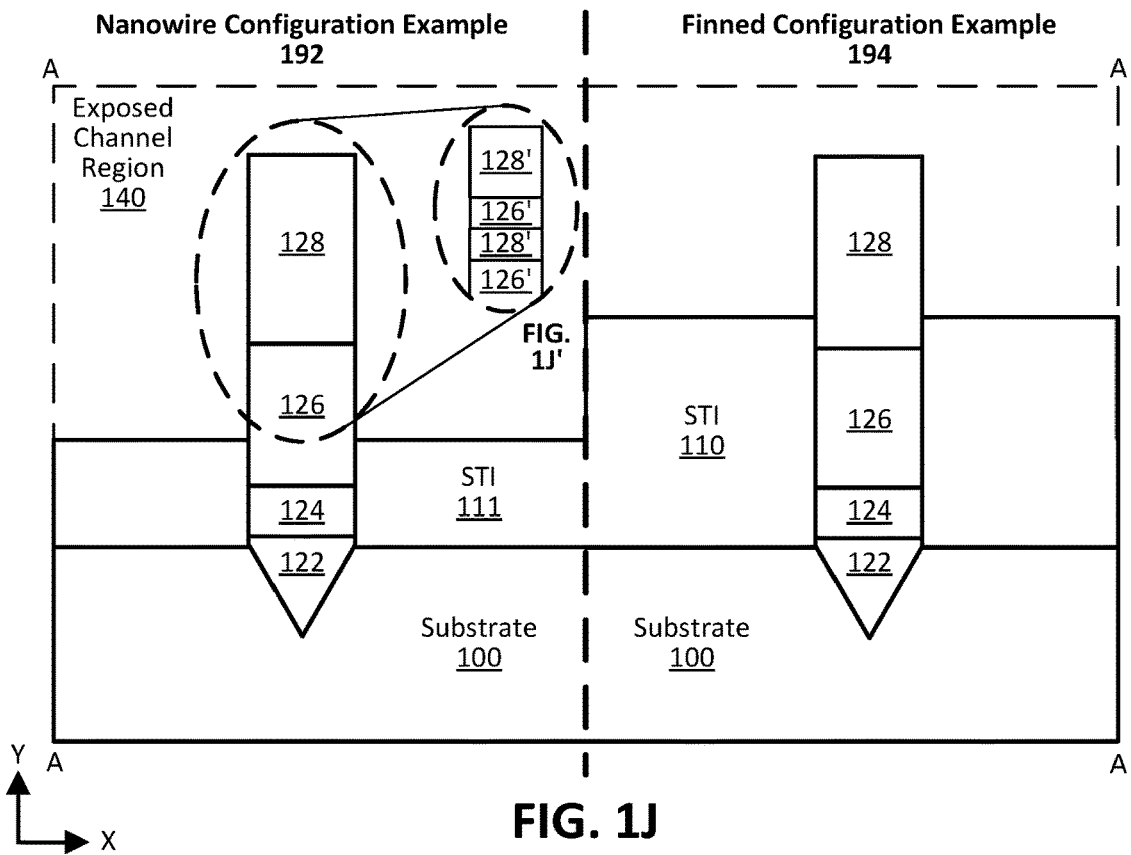

FIG. 1J illustrates an example IC structure after the STI 110 layer of FIG. 1I is recessed for the nanowire configuration example 192, in accordance with an embodiment. As shown, the recessed STI layer is indicated as 111, while the non-recessed STI layer (relative to the structure of FIG. 1I) is indicated as 110. The STI layer may be recessed to allow access to the sub-channel region 125 indicated in FIG. 1I, such that at least a portion of the sub-channel region 125 can be removed (e.g., via etch) to release the channel layer 128 for use as a nanowire (or nanoribbon) in a transistor having a gate-all-around (GAA) configuration. For instance, in this example embodiment, STI layer 110 was recessed to a location indicated by STI layer 111 such that the top plane of STI layer 111 is level with a portion of sub-channel layer 126 as shown, thereby allowing access to sub-channel layer 126 via etch processing. FIG. 1J' illustrates a blown out portion of the nanowire configuration example of the IC structure of FIG. 1J, showing the alternative multilayer fin stack of FIG. 1D', in accordance with an embodiment. As can be understood based on FIG. 1J', the STI layer 111 was recessed below the top plane of the bottom-most sacrificial sub-channel layer 126', such that both sacrificial sub-channel layers 126' can be subsequently removed (e.g., via a selective etch process) to release both nanowire channel layers 128', in an example embodiment.

Figure 1K:
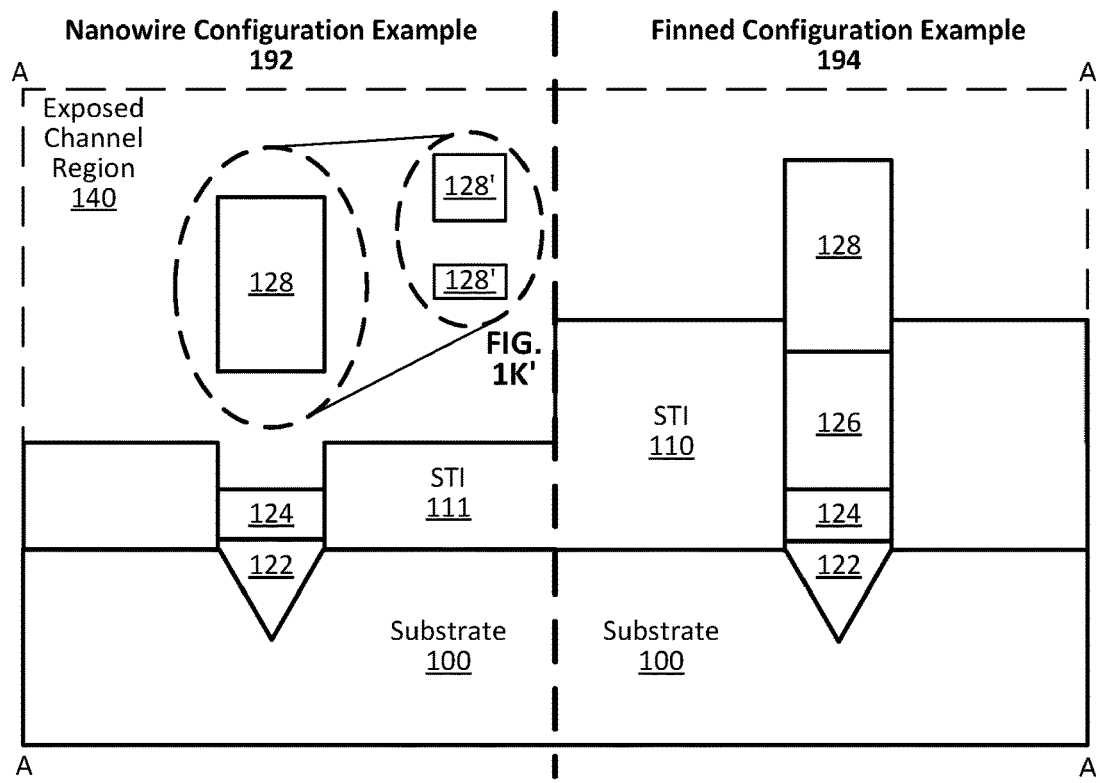

FIG. 1K illustrates an example IC structure after a selective etch process has been performed on the nanowire configuration example 192 side of the structure to remove the sub-channel layer 126 material and release channel layer 128 to be used as a nanowire in a GAA transistor configuration, in accordance with an embodiment. In some embodiments, the selective etch process to remove sub-channel layer 126 (or at least partially remove it, such that channel layer 128 becomes a floating nanowire) may include an etch process using an etchant that removes material of the sub-channel layer 126 at a rate of at least 2, 3, 4, 5, 10, 20, 50, or 100 times faster than the etchant removes material of channel layer 128. Note that in some embodiments, multiple etch processes may be performed, as desired. To provide an example case, where channel layer 128 includes InGaAs and sub-channel layer 126 includes GaAs, a selective etch process may be performed using an etchant that removes GaAs faster than it removes InGaAs, such that the GaAs sub-channel layer can be removed while leaving the InGaAs channel layer intact (or at least partially intact). Note that in this example embodiment, the selective etch process left barrier layer 124 remaining, which may be due to the presence of dilute-nitride alloying in barrier layer 124 (even where barrier layer 124 and sub-channel layer 126 include the same base III-V material). However, the present disclosure is not intended to be so limited. For instance, in embodiments of the technique targeted for nanowire/GAA transistors, the selective etch process used to remove sub-channel layer 126 from channel layer 128 may also partially or completely remove barrier layer and/or optional nucleation layer 122 (where initially present), in some cases. Further, in some such cases, the selective etch process may even remove a portion of substrate 100 if the selective etch is able to etch through layers 124 and 122. FIG. 1K' illustrates the blown out view of FIG. 1J', where sacrificial sub-channel layers 126' were both removed via the selective etch process described above, in accordance with an embodiment. Recall that in the case of nanowire (or nanoribbon or GAA) transistor configurations, any number of nanowires/nanoribbons may be used, such as 1, 2, 3, 4, 5, or more.

Figure 1L:
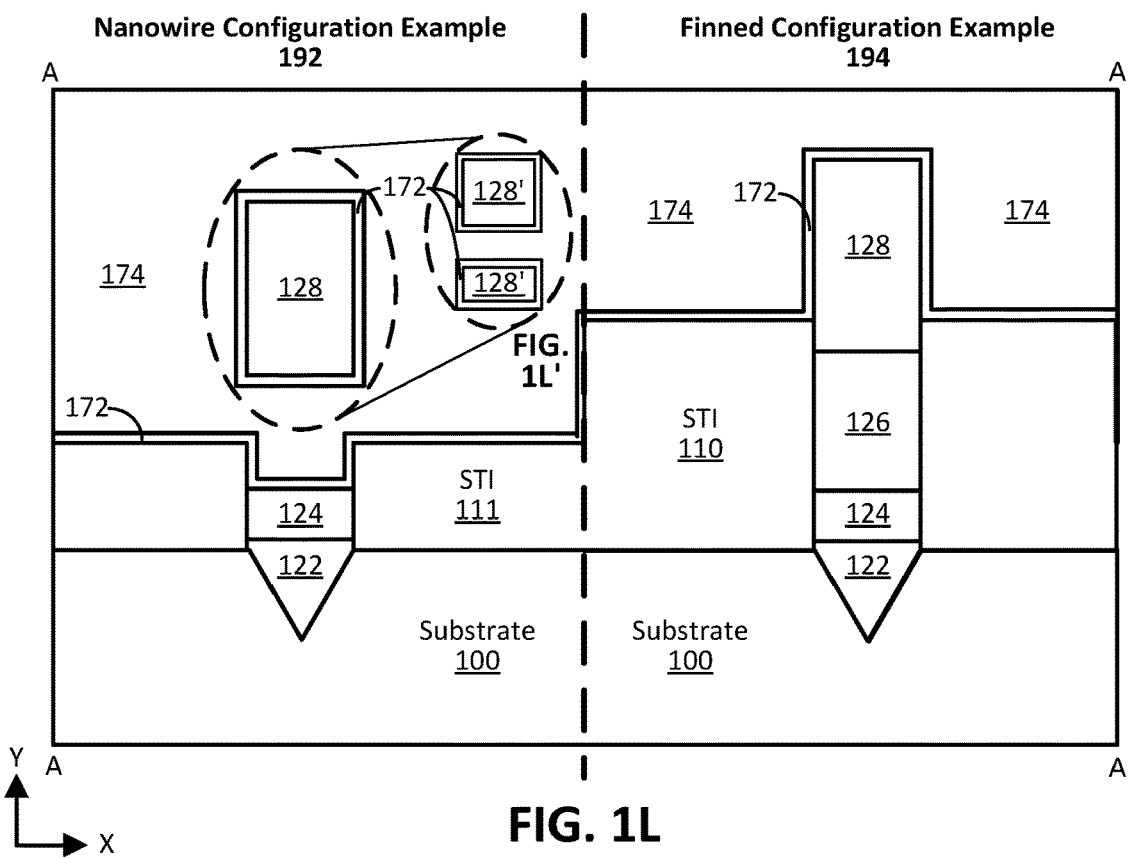

FIG. 1L illustrates an example IC structure after gate processing has been performed on the structure of FIG. 1K, in accordance with an embodiment. In some embodiments, the gate stack processing includes forming gate dielectric layer 172 and gate (or gate electrode) 174, using any suitable techniques, such as replacement metal gate (RMG) techniques, for instance. As can be seen in this example embodiment, the gate dielectric layer 172 is conformally deposited, such that is has a substantially similar thickness on all surfaces upon which it grows and tracks with the topography of the surfaces upon which it grows. Further, as shown in FIG. 1L, the gate stack (including gate dielectric layer 172 and gate 174, in this embodiment) wraps around nanowire 128 (and thus, it has a gate-all-around configuration) in the nanowire configuration example 192. Further still, the gate stack (including gate dielectric layer 172 and gate 174, in this embodiment) is proximate to three sides of the channel region 129 of channel layer 128, such that the finned configuration example 194 may include a tri-gate configuration. A double-gate configuration may have been achieved by placing insulating material on the top of channel layer 128 in the finned configuration example 194 prior to forming the final gate stack, for example. Further still, as shown in the IC structure of FIG. 1L, gate dielectric layer 172 also conformally grows on the base portion of the structure from FIG. 1K, such as on and over STI material 111/110 and on barrier layer 124, in this example embodiment. FIG. 1L' is provided to illustrate gate dielectric layer 172 and gate 174 formed on the two nanowires/nanoribbons 128' from FIG. 1K', in accordance with an embodiment. Recall that in embodiments not employing nanowire (or nanoribbon or GAA) transistor configurations, a gate first process flow may be used, wherein the final gate stack is initially formed prior to the S/D processing and a dummy gate stack is not utilized, such as when fabricating finned or planar transistors, for example. In some such gate first process flows, the gate stack processing of FIG. 1L would not be performed, as the final gate would have been formed in the structure of FIG. 1F, for example.

In some embodiments, gate dielectric layer 172 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 172 to improve its quality when a high-k material is used, for example. In some embodiments, gate (or gate electrode) 174 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric layer 172 may be relatively thin, such as having a thickness in the range of 1-20 nm, for example, or some other suitable thickness as will be apparent in light of this disclosure. In some embodiments, gate 174 may have a thickness in the range of 10-200 nm, for example, or some other suitable thickness as will be apparent in light of this disclosure. In some embodiments, gate dielectric layer 172 and/or gate 174 may include a multilayer structure of two or more material layers, for example. In some embodiments, gate dielectric layer 172 and/or gate 174 may include grading (e.g., increasing and/or decreasing) the content/concentration of one or more materials in at least a portion of the feature(s). Additional layers may be present in the final gate stack, in some embodiments, such as one or more work function layers or other suitable layers, for example.

Numerous variations on the geometry of the structures depicted in FIGS. 1A-M may occur, in some embodiments. For example, although the cross-sectional geometry of nanowires 126/126' are generally depicted as rectangular (e.g., as shown in FIGS. 1L and 1L'), in some embodiments, the nanowires may have different cross-sectional geometry. For instance, in some embodiments, the nanowires formed using the techniques described herein may have cross-sectional geometries more-so resembling a circle, semi-circle, ellipse, semi-ellipse, oval, semi-oval, square, parallelogram, rhombus, trapezoid, diamond, triangle, pentagon, hexagon, and so forth, regardless of orientation. Further, in some embodiments, the cross-sectional geometry of the channel region 129 for transistor employing a finned configuration may not be rectangular as shown in FIG. 1L, for example. For instance, in some embodiments, the cross-sectional geometry of the channel region for finned transistors may include a conical or semi-elliptical shape, a pyramid or triangular shape, a mushroom shape, and/or variations to the top portion of the 'fin' (e.g., rounding of edges, erosion of material, and so forth) that may be caused by the processing used to form the fin and any subsequent processing to form the finned transistor. Further still, as previously described, the bottom of the replacement fins may have varying different geometries, such as geometries similar to those illustrated in FIGS. 1C' and 1C'', for example. Additional variations will be apparent in light of this disclosure, such as variations in how the gate wraps around each nanowire in GAA transistor configurations (e.g., only substantially wraps around each nanowire, such that it wraps around at least 75, 80, 85, 90, 95, or 98 percent of each nanowire), whether there is a void below the channel region of GAA transistor configurations (e.g., in the sub-channel region, as a result of the deposition of the gate stack not being able to form material at that location), and so forth.

Figure 1M:
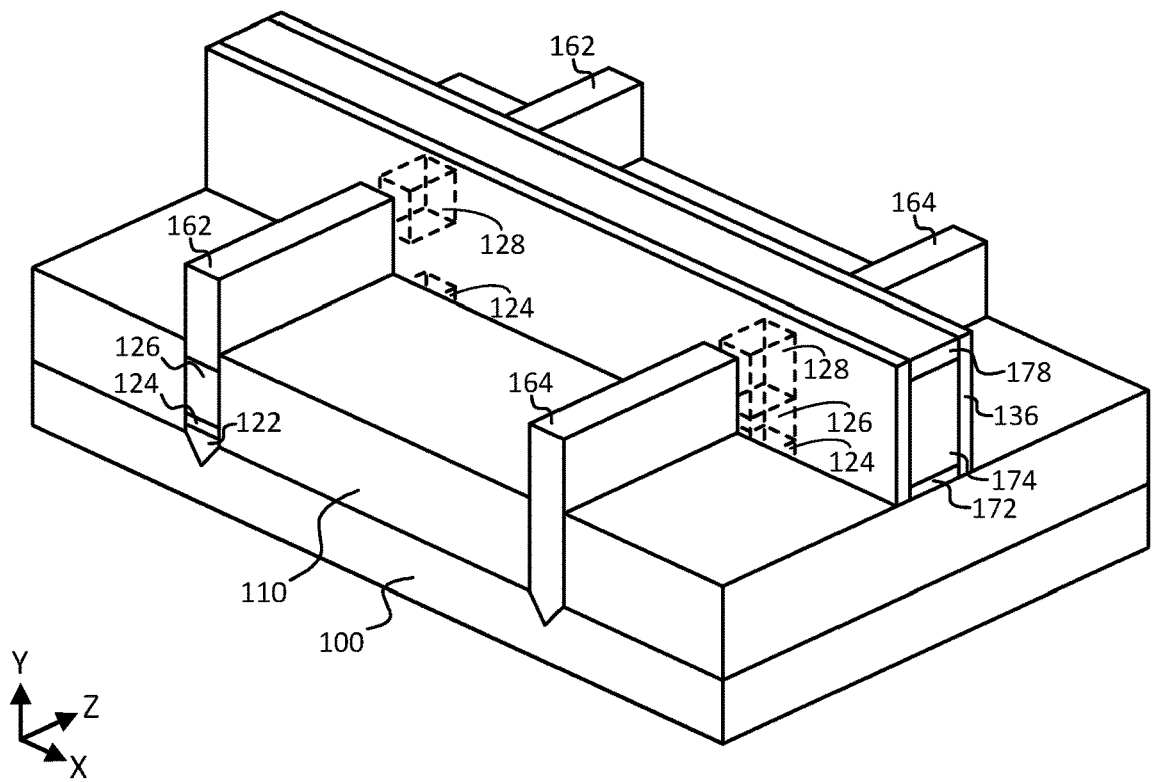

FIG. 1M illustrates an example IC structure after source and drain (S/D) processing has been performed on the structure of FIG. 1L, in accordance with an embodiment. Note that the example structure of FIG. 1M reverts to the perspective views of FIGS. 1A-H. As shown in the structure of FIG. 1M, the channel region of FIG. 1H has been processed as described with reference to FIGS. 1I-L, in this example embodiment. In addition, hardmask 178 has been formed on the gate stack, in this example case, to protect the gate stack during other processing, such as during the source/drain processing that occurred to form S/D regions 162 and 164. As shown in FIG. 1M, S/D regions 160 are adjacent to the nanowire/GAA channel region and S/D regions 162 are adjacent to the finned channel region (e.g., channel regions in example structures 192 and 194 of FIG. 1L, respectively). In some embodiments, the S/D processing may include any suitable techniques to form S/D regions 160 and 162. For instance, as shown in FIG. 1M, S/D region 162 still includes optional nucleation layer 122, barrier layer 124, and sub-channel layer 126 from the multilayer III-V material stack, but channel layer 128 may have either been removed and replaced with replacement material or may have been converted to suitable S/D material (e.g., via doping of channel layer 128) to form S/D regions 162, in accordance with some embodiments. In some such embodiments, where the material is removed and replaced, it may be replaced with any suitable material, such as III-V material, and may be doped using any suitable techniques. In other such embodiments, channel layer 128, in the S/D regions 162, may be doped (e.g., via ion implantation) to convert those portions of the channel layer 128 to suitable S/D region 162 material. For instance, in an example embodiment, the channel layer 128 material, which can include any suitable III-V material, such as InAs, InSb, or InGaAs, to name some examples, may have any suitable n-type and/or p-type dopants introduced into that material region (e.g., Si impurity dopants, in the case of a desired n-type doping scheme). Thus, layers 122, 124, and/or 126 may remain below the final S/D regions (e.g., regions 162), in some embodiments. In other embodiments, the entirety of the multilayer replacement stack (e.g., including layers 122, 124, 126, and 128) may be removed and replaced with the final S/D material, such as what occurred with respect to S/D regions 164, for example.

Generally, in some embodiments, S/D regions 160 and 162 may include any suitable material and, optionally, any suitable dopants, depending on the end use or target application. For example, in some embodiments, the S/D regions may include one or more III-V materials, such as InAs, InGaAs, InSb, InAsSb, or InGaSb, to name a few example materials. Further, in some such embodiments, the S/D region material may include n-type dopants and/or p-type dopants, depending on the end use or target application. For example, in the case of an n-MOS device, the S/D regions may both be n-type doped. In another example case of a tunnel FET (TFET) device, the source and drain regions may be oppositely typed doped (e.g., one n-type doped and the other p-type doped). Further yet, in some embodiments, one or both of the S/D regions may include a multilayer structure of two or more material layers, for example. In some embodiments, one or both of the S/D regions may include grading (e.g., increasing and/or decreasing) the content/concentration of one or more materials in at least a portion of the region(s). Note that in some embodiments, the S/D processing may be performed prior to the processing of the replacement gate stack in a gate last flow. For instance using the IC structures described herein, the S/D processing may have been performed after forming the dummy gate in the structure of FIG. 1F and prior to the removal of the gate stack in FIG. 1H.

Once the S/D regions have been processed, additional IC processing may be performed to complete the fabrication of one or more transistors or transistor-based devices. For example, a layer of insulator material may be formed over the IC structure, such as an ILD layer as previously described to allow for S/D contact processing. In some embodiments, S/D contacts may be formed using any suitable techniques, such as forming contact trenches in the ILD layer over the respective S/D regions and depositing metal or metal alloy (or other suitable electrically conductive material) in the trenches. In some embodiments, S/D contact formation may include silicidation, germinidation, and/or annealing processes, for example. In some embodiments, S/D contacts may include aluminum or tungsten, although any suitable conductive metal or alloy can be used, such as silver, nickel-platinum, or nickel-aluminum, for example. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

Additional processing to complete the IC after S/D contact processing may include back-end or back-end-of-line (BEOL) processing to form one or more metallization layers and/or to interconnect the transistor devices formed, for example. Any other suitable processing may be performed, as will be apparent in light of this disclosure. Note that the techniques and resulting IC structures formed therefrom are presented in a particular order for ease of description. However, one or more of the processes may be performed in a different order or may not be performed at all. For example, depositing nucleation layer 122 need not be performed, as nucleation layer 122 is an optional layer. Further, the processes described with reference to forming the nanowire transistor configuration example 192 need not be performed when fabricating transistors employing a different configuration. Further still, a gate first or gate last process flow may be used as desired. Recall that the techniques may be used to form one or more transistor devices including any of the following: field-effect transistors (FETs), metal-oxide-semiconductor FETs (MOSFETs), tunnel-FETs (TFETs), planar configurations, finned configurations (e.g., fin-FET, tri-gate, dual-gate), and/or nanowire (or nanoribbon or gate-all-around) configurations (having any number of nanowires). In addition, the devices formed may include p-type transistor devices (e.g., p-MOS) and/or n-type transistor devices (e.g., n-MOS). Further, the transistor-based devices may include complementary MOS (CMOS) devices or quantum devices (few to single electron), to name a few examples. Numerous variations and configurations will be apparent in light of this disclosure.

Example Band-Alignment Diagram

Figure 2:
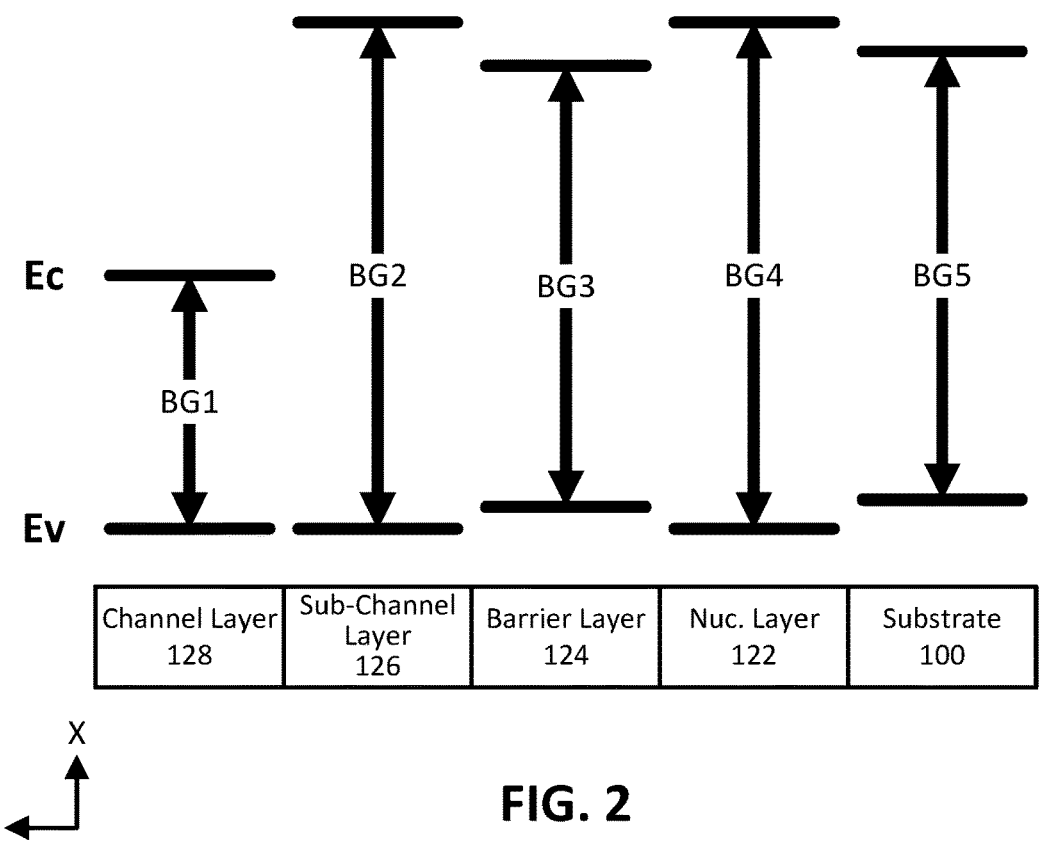
FIG. 2 illustrates an example band-alignment diagram for the example multilayer III-V material fin stack formed on a substrate described herein, in accordance with an embodiment of the present disclosure.

FIG. 2 illustrates an example band-alignment diagram for the example multilayer III-V material fin stack formed on a substrate described herein, in accordance with an embodiment of the present disclosure. The bottom horizontal line shown in the upper portion of the diagram represents the maximum valence band energy (Ev) and the top horizontal line represents the minimum conduction band energy (Ec), such that the vertical line with the arrows between those two horizontal lines represents the corresponding bandgaps (BGs) of the underlying layer. Specifically, as shown in FIG. 2, the multilayer III-V material fin stack formed on substrate 100 includes, from left to right, channel layer 128, sub-channel layer 126, barrier layer 124, nucleation (nuc.) layer 122, and substrate 100, as variously described herein, with the corresponding example BGs above each layer. The BGs are numbered BG1-5 to correspond to the layers listed in the previous sentence, respectively (e.g., BG1 corresponds to layer 128, BG2 corresponds to layer 126, and so forth). Note that the multilayer III-V fin stack formed on substrate 100 was previously shown in a vertical fashion (e.g., with substrate 100 on the bottom), but is shown in a horizontal fashion in FIG. 2 for ease of illustrating the bandgaps of the corresponding layers (and thus, the X and Y axes have been adjusted accordingly).

For purposes of illustration, in this example case, the band-alignment diagram includes the following hetero epitaxial stack configuration, from left to right: channel layer 128 including $In_xGa_{1-x}As$ (where x is approximately 0.53); sub-channel layer 126 including GaAs; dopant diffusion barrier layer 124 including $GaAs_{1-y}N_y$ (where y is less 0.03); nucleation (nuc.) layer 122 including GaAs; and substrate including Si. Therefore, in such an example configuration, the sub-channel layer 126 and nucleation layer 122 include the same material and have the same bandgap, such that BG2 is equivalent to BG4 (which is shown in FIG. 2). Also note that BG2 is larger than BG1, because the material of sub-channel layer 126 has a larger bandgap than the material of channel layer 128, in this example embodiment. As can be understood based on this disclosure, having a pseudomorphic (e.g., less than the critical thickness of the material) layer of $GaAs_{1-y}N_y$ (where y is less 0.03) for barrier layer 124 may be desired since the lattice mismatch of that barrier layer 124 with the GaAs sub-channel layer 122 of this example case would become inconsequential. The amount of N in the dilute alloy of barrier layer 124 can be adjusted to determine the band alignment of the conduction band and valence band of the barrier layer 124 with respect to the GaAs sub-channel layer 126 of this example case. In this example case, where y is less than 0.03 (as shown in FIG. 2), there are no major barriers in the valence band for hole flow to the substrate 100. Further, in this example case, the bandgap of the $GaAs_{1-y}N_y$ material where y is less than 0.03 has a conduction band that is lower (0.2 eV lower, in this example case) than the conduction band of the GaAs material and a valence band that is higher (0.05 eV, in this example case) than the valence band of GaAs, as shown in FIG. 2. Thus, adjusting the value of y in the $GaAs_{1-y}N_y$ material (and more generally, in any $III-V_{1-y}N_y$ material) could result in the conduction band of the barrier layer 124 being higher than the conduction band of the sub-channel layer 126. However, it would be undesirable for the valence band of the barrier layer 124 to be lower than that of the sub-channel layer 126, as can be understood based on this disclosure. Therefore, the y value in the $III-V_{1-y}N_y$ material of the barrier layer 124 may be selected with such considerations in mind, in some embodiments.

Example System

Figure 3:
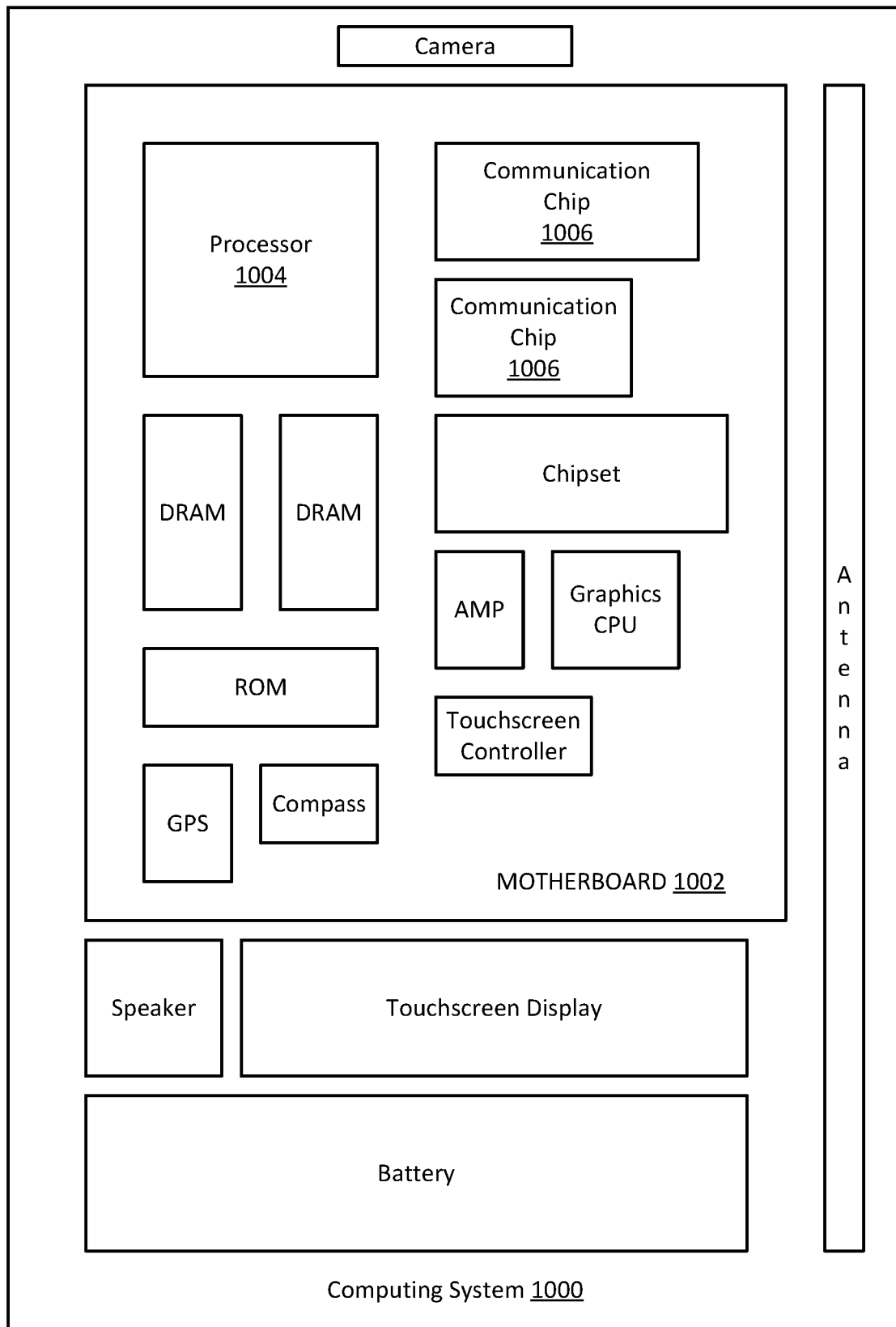
FIG. 3 illustrates a computing system implemented with integrated circuit structures and/or transistor devices formed using the techniques disclosed herein, in accordance with some embodiments of the present disclosure.

FIG. 3 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including: a substrate; a transistor including a channel region formed above the substrate, the channel region including group III-V semiconductor material, and a gate at least above the channel region; and a barrier layer between the channel region and the substrate, the barrier layer including group semiconductor material having an alloy of nitrogen (N), such that N constitutes only a portion of the group V component of that barrier layer material.

Example 2 includes the subject matter of Example 1, wherein the substrate includes silicon (Si).

Example 3 includes the subject matter of any of Examples 1-2, wherein the channel region includes indium.

Example 4 includes the subject matter of any of Examples 1-3, further including a sub-channel layer between the channel region and the barrier layer, the sub-channel layer including group III-V material.

Example 5 includes the subject matter of Example 4, wherein the barrier layer includes the same group III-V semiconductor material as the group III-V semiconductor material included in the sub-channel layer.

Example 6 includes the subject matter of any of Examples 4-5, wherein the group III-V material included in the channel region has a smaller bandgap than the group III-V material included in the sub-channel layer.

Example 7 includes the subject matter of any of Examples 1-6, wherein the alloy of N in the group III-V semiconductor material included in the barrier layer is at most 5 percent of the group V component of that barrier layer material Example 8 includes the subject matter of any of Examples 1-7, wherein the barrier layer further includes aluminum.

Example 9 includes the subject matter of any of Examples 1-8, wherein the barrier layer further includes carbon.

Example 10 includes the subject matter of any of Examples 1-9, wherein the barrier layer has a maximum thickness between the channel region and the substrate in the range of 5-30 nanometers.

Example 11 includes the subject matter of any of Examples 1-10, further including a nucleation layer between the barrier layer and the substrate, the nucleation layer including group III-V semiconductor material, wherein the barrier layer includes the same group III-V semiconductor material as the group III-V semiconductor material included in the nucleation layer.

Example 12 includes the subject matter of any of Examples 1-11, wherein the transistor includes at least one of a finned, tri-gate, finned field-effect transistor (FinFET) configuration, and at least the channel region is included in a fin.

Example 13 includes the subject matter of Example 12, wherein the barrier layer is also included in the fin.

Example 14 includes the subject matter of any of Examples 1-3 or 7-11, wherein the transistor includes at least one of a nanowire, nanoribbon, gate-all-around (GAA) configuration, and the channel region includes one or more nanowires and/or nanoribbons.

Example 15 includes the subject matter of any of Examples 1-14, wherein the transistor is an n-channel metal-oxide-semiconductor field-effect transistor (n-MOS).

Example 16 includes the subject matter of any of Examples 1-15, wherein the transistor is one of a metal-oxide-semiconductor field-effect transistor (MOSFET) and a tunnel field-effect transistor (TFET).

Example 17 is a computing system including the subject matter of any of Examples 1-16.

Example 18 is an integrated circuit (IC) including: a substrate including group IV semiconductor material; a transistor including a channel region formed above the substrate, the channel region including group III-V semiconductor material, a gate at least above the channel region, a gate dielectric layer between the gate and the channel region, and source and drain (S/D) regions adjacent the channel region; and a barrier layer between the channel region and the substrate, the barrier layer including group III-V semiconductor material further including a dilute alloy of nitrogen (N), such that the group III-V semiconductor material further including a dilute alloy of N is represented as III-V:N material and includes a total atomic percentage of 100 percent, wherein N is less than 5 percent of the total atomic percentage of the III-V:N material.

Example 19 includes the subject matter of Example 18, wherein the substrate includes silicon (Si).

Example 20 includes the subject matter of any of Examples 18-19, wherein the channel region includes indium.

Example 21 includes the subject matter of any of Examples 18-20, further including a sub-channel layer between the channel region and the barrier layer, the sub-channel layer including group III-V material.

Example 22 includes the subject matter of Example 21, wherein the barrier layer includes the same group III-V semiconductor material as the group III-V semiconductor material included in the sub-channel layer.

Example 23 includes the subject matter of any of Examples 21-22, wherein the group III-V material included in the channel region has a smaller bandgap than the group III-V material included in the sub-channel layer.

Example 24 includes the subject matter of any of Examples 18-23, wherein the N content in the III-V:N material is less than 1.5 percent of the total atomic percentage of the III-V:N material.

Example 25 includes the subject matter of any of Examples 18-24, wherein the barrier layer further includes aluminum.

Example 26 includes the subject matter of any of Examples 18-25, wherein the barrier layer further includes carbon.

Example 27 includes the subject matter of any of Examples 18-26, wherein the barrier layer has a maximum thickness between the channel region and the substrate in the range of 5-30 nanometers.

Example 28 includes the subject matter of any of Examples 18-27, wherein the barrier layer is positioned closer to the substrate than the channel region.

Example 29 includes the subject matter of any of Examples 18-28, further including a nucleation layer between the barrier layer and the substrate, the nucleation layer including group III-V semiconductor material, wherein the barrier layer includes the same group III-V semiconductor material as the group III-V semiconductor material included in the nucleation layer.

Example 30 includes the subject matter of any of Examples 18-29, wherein the transistor includes at least one of a finned, tri-gate, finned field-effect transistor (FinFET) configuration, and at least the channel region is included in a fin.

Example 31 includes the subject matter of any of Examples 18-20 or 24-29, wherein the transistor includes at least one of a nanowire, nanoribbon, gate-all-around (GAA) configuration, and the channel region includes one or more nanowires and/or nanoribbons.

Example 32 includes the subject matter of any of Examples 18-31, wherein the S/D regions are n-type doped.

Example 33 includes the subject matter of any of Examples 18-32, wherein the transistor is one of a metal-oxide-semiconductor field-effect transistor (MOSFET) and a tunnel field-effect transistor (TFET).

Example 34 is a computing system including the subject matter of any of Examples 18-33. Example 35 is a method of forming an integrated circuit (IC), the method including:

forming a barrier layer above a substrate, the substrate including group IV material, the barrier layer including group III-V semiconductor material having an alloy of nitrogen (N), such that N constitutes only a portion of the group V component of that barrier layer material; and forming a channel region of a transistor above the barrier layer, the channel region including group III-V semiconductor material, such that the barrier layer is between the channel region and the substrate.

Example 36 includes the subject matter of Example 35, wherein the barrier layer is formed on a nucleation layer that is between the substrate and the barrier layer, the nucleation layer including group III-V semiconductor material.

Example 37 includes the subject matter of Example 36, wherein the barrier layer includes the same group III-V semiconductor material as the group III-V semiconductor material included in the nucleation layer.

Example 38 includes the subject matter of any of Examples 35-37, wherein the barrier layer is formed pseudomorphically such that a maximum thickness of the barrier layer between the channel region and the substrate is less than the critical thickness of the barrier layer material above which dislocations are introduced.

Example 39 includes the subject matter of any of Examples 35-38, further including a sub-channel layer between the channel region and the barrier layer, the sub-channel layer including group III-V semiconductor material that is different than the group III-V semiconductor material included in the channel region.

Example 40 includes the subject matter of any of Examples 35-39, wherein the barrier layer is formed via epitaxial growth in a fin-shaped trench formed in a layer of insulator material.

Example 41 includes the subject matter of any of Examples 35-40, wherein the substrate includes silicon (Si).

Example 42 includes the subject matter of any of Examples 35-41, wherein the alloy of N in the group III-V semiconductor material included in the barrier layer is at most 3 percent of the group V component of that barrier layer material.

Example 43 includes the subject matter of any of Examples 35-42, further including releasing the channel region from underlying material via selective etch processing that removes material below the channel region at a rate of at least 2 times faster than it removes the group III-V semiconductor material included in the channel region.

Example 44 includes the subject matter of any of Examples 35-43, further including forming a gate stack above the channel region, the gate stack including a gate and a gate dielectric layer, wherein the gate dielectric layer is between the channel region and the gate.

Example 45 includes the subject matter of any of Examples 35-44, further including forming source and drain (S/D) regions adjacent to the channel region, wherein the S/D regions are n-type doped.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
   a substrate;
   a transistor including
      a semiconductor region above the substrate, the semiconductor region including a first group III-V semiconductor material,
      a source region and a drain region each including a second group III-V semiconductor material, the semiconductor region between the source and drain regions, wherein a dopant concentration in the source and drain regions is greater than any dopant concentration of the semiconductor region, and
      a gate structure at least above the semiconductor region; and
   a layer between the source region and the substrate and between the drain region and the substrate, the layer including a third group III-V semiconductor material different from the first and second group III-V materials, the third group III-V semiconductor material including an alloy of nitrogen (N), such that N constitutes only a portion of the group V component of the layer material.

2. The IC of claim 1, wherein the substrate includes silicon (Si).

3. The IC of claim 1, wherein the semiconductor region includes indium.

4. The IC of claim 1, wherein the layer is also between the semiconductor region and the substrate, and the gate structure is on top and side surfaces of the semiconductor region to provide a double-gate or tri-gate configuration, and the semiconductor region is a first semiconductor region, the IC further comprising a second semiconductor region between the first semiconductor region and the layer, the second semiconductor region including a fourth group III-V material.

5. The IC of claim 4, wherein the fourth group III-V material includes the same material as the third group III-V semiconductor material but with less or no nitrogen.

6. The IC of claim 4, wherein the first group III-V material included in the first semiconductor region has a smaller bandgap than the fourth group III-V material included in the second semiconductor region.

7. The IC of claim 1, wherein the alloy of N in the third group III-V semiconductor material included in the layer is at most 5 percent of the group V component of that layer material.

8. The IC of claim 1, wherein the layer further includes aluminum.

9. The IC of claim 1, wherein the layer further includes carbon.

10. The IC of claim 1, wherein the layer has a maximum thickness in the range of 5-30 nanometers.

11. The IC of claim 1, wherein the layer is a barrier layer, the IC further comprising a nucleation layer between the barrier layer and the substrate, wherein the nucleation layer includes the same material as the third group III-V semiconductor material but with less or no nitrogen.

12. The IC of claim 1, wherein the semiconductor region includes a nanowire or a nanoribbon, and the gate structure wraps around the nanowire or a nanoribbon.

13. The IC of claim 12, wherein the layer is also between the semiconductor region and the substrate.

14. An integrated circuit (IC) comprising:
a substrate including group IV semiconductor material;
a transistor including
- a semiconductor region above the substrate, the semiconductor region including group III-V semiconductor material,
- a gate electrode at least above the semiconductor region,
- a high-k dielectric material between the gate electrode and the semiconductor region, and
- a source region and a drain region adjacent the semiconductor region, such that the semiconductor region is between the source and drain regions; and a layer under the semiconductor region and between the semiconductor region and the substrate, the layer having a different material composition than the semiconductor region and including group III-V semiconductor material further including a dilute alloy of nitrogen (N), such that the layer is represented as III-V:N material and includes a total atomic percentage of 100 percent, wherein N is less than 5 percent of the total atomic percentage of the III-V:N material.

15. The IC of claim 14, wherein the substrate includes silicon (Si).

16. The IC of claim 14, wherein the N content in the III-V:N material is less than 1.5 percent of the total atomic percentage of the III-V:N material.

17. The IC of claim 14, wherein the layer is positioned closer to the substrate than the semiconductor region.

18. An integrated circuit (IC) comprising:
a substrate including group IV semiconductor material;
a transistor including
- a semiconductor region above the substrate, the semiconductor region including group III-V semiconductor material,
- a gate electrode at least above the semiconductor region,
- a high-k dielectric material between the gate electrode and the semiconductor region, and
- a source region and a drain region adjacent the semiconductor region, such that the semiconductor region is between and in contact with the source and drain regions; and a layer between the semiconductor region and the substrate, the layer having a different material composition than the semiconductor region and including group III-V semiconductor material having an alloy of nitrogen (N), such that N constitutes only a portion of the group V component of the layer material.

19. The IC of claim 18, wherein the alloy of N in the group III-V semiconductor material included in the layer is at most 5 percent of the group V component of that layer material.

20. The IC of claim 18, wherein the layer between the semiconductor region and the substrate is a barrier layer, the IC further comprising a nucleation layer between the barrier layer and the substrate, the nucleation layer including group III-V semiconductor material, wherein the barrier layer includes the same material as the group III-V semiconductor material included in the nucleation layer, but with a larger nitrogen content.

* * * * *